US007211843B2

(12) United States Patent
Low et al.

(10) Patent No.: US 7,211,843 B2
(45) Date of Patent: May 1, 2007

(54) SYSTEM AND METHOD FOR PROGRAMMING A MEMORY CELL

(75) Inventors: Khim L. Low, Singapore (SG); Todd L. Brooks, Laguna Beach, CA (US); Agnes Woo, Encino, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 284 days.

(21) Appl. No.: 10/355,260

(22) Filed: Jan. 31, 2003

(65) Prior Publication Data

US 2004/0037117 A1  Feb. 26, 2004

Related U.S. Application Data

(63) Continuation-in-part of application No. 10/115,013, filed on Apr. 4, 2002, now Pat. No. 6,580,156.

(60) Provisional application No. 60/377,238, filed on May 3, 2002.

(51) Int. Cl.
*H01L 27/10* (2006.01)
(52) U.S. Cl. .............. 257/209; 257/173; 257/529; 257/530; 257/665; 327/525; 365/225.7; 365/177
(58) Field of Classification Search ............. 257/173, 257/209, 529, 665, 910; 102/202.4; 361/275.1; 438/467, 600, 601
See application file for complete search history.

(56) References Cited

U.S. PATENT DOCUMENTS

| | | | | |
|---|---|---|---|---|
| 5,130,777 A | * | 7/1992 | Galbraith et al. | ............ 257/530 |
| 5,644,216 A | * | 7/1997 | Lopez et al. | ................ 323/315 |
| 5,828,607 A | * | 10/1998 | Bushey et al. | ......... 365/189.11 |
| 6,258,700 B1 | * | 7/2001 | Bohr et al. | ................. 438/467 |
| 6,392,931 B1 | * | 5/2002 | Pasotti et al. | .......... 365/185.19 |

OTHER PUBLICATIONS

ARM Technical Support Info, www.arm.com/support/faqdev/1277.html.*

* cited by examiner

*Primary Examiner*—Nathan Flynn
*Assistant Examiner*—Scott Wilson
(74) *Attorney, Agent, or Firm*—Sterne, Kessler, Goldstein & Fox P.L.L.C.

(57) ABSTRACT

The present invention relates to systems and methods for programming a memory cell. More specifically, the present invention relates to a controlled application of current to a memory cell over a controlled time period. The invention utilizes a current mirror configuration having a first transistor and a second transistor, wherein the second transistor is coupled to the memory cell. Programming of the memory cell includes applying a voltage to the first transistor, whereby a first current is generated in the first transistor. A gate of the second transistor is coupled to the first transistor, whereby a second current is generated in the second transistor. The second current is proportional to the first current. The second current is provided to the memory cell, whereby the second current programs the memory cell.

37 Claims, 29 Drawing Sheets

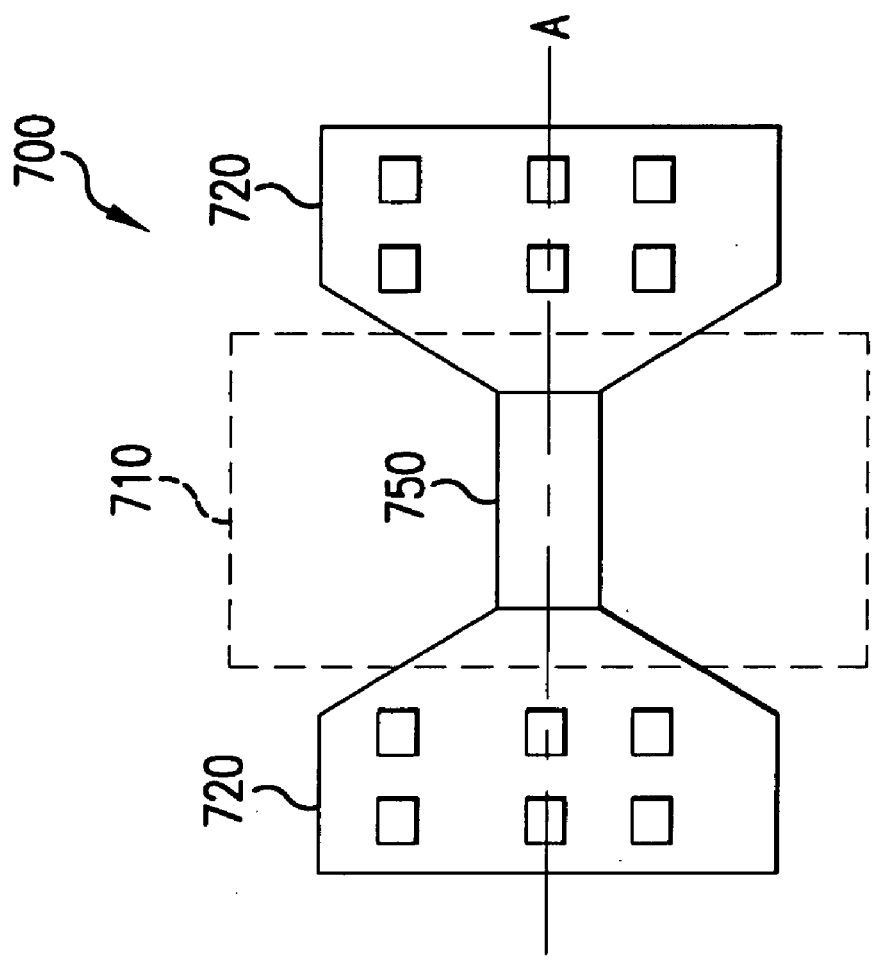

SYSTEM AND METHOD FOR PROGRAMMING A MEMORY CELL

CROSS-REFERENCE TO RELATED APPLICATIONS

This application claims priority to U.S. Provisional Patent Application No. 60/377,238, filed May 3, 2002, which is incorporated by reference herein in its entirety.

This application is a continuation-in-part of a U.S. patent application Ser. No. 10/115,013, filed Apr. 4, 2002, now U.S. Pat. No. 6,580,156 to Akira et al. which is incorporated by reference herein in its entirety.

BACKGROUND OF THE INVENTION

1. Field of the Invention

The present invention is directed to semiconductor fuses and systems and methods for programming semiconductor fuses.

2. Background Art

In the field of data storage, there are two main types of storage elements. The first type is volatile memory that has the information stored in a particular storage element, and the information is lost the instant the power is removed from a circuit. The second type is a nonvolatile storage element, in which the information is preserved even with the power removed. In regards to the nonvolatile storage elements, some designs allow multiple programming, while other designs allow one-time programming. Typically, the manufacturing techniques used to form nonvolatile memories are quite different from a standard logic process. The nonvolatile memory manufacturing techniques increase the complexity and chip size.

Complimentary Metal Oxide Semiconductor (CMOS) technology is the integration of both NMOS and PMOS transistors on a silicon substrate (collectively know as MOS field effect transistors, or MOSFETs). The NMOS transistor consists of a N-type doped polysilicon gate, a channel conduction region, and source/drain regions formed by diffusion of N-type dopants in the silicon substrate. The channel region separates the source from the drain in the lateral direction, whereas a layer of dielectric material that prevents electrical current flow separates the polysilicon gate from the channel. Similarly, the architecture is the same for the PMOS transistor, except a P-type dopant is used.

The dielectric material separating the polysilicon gate from the channel region, henceforth referred to as the gate oxide, usually consists of the thermally grown silicon dioxide ($SiO_2$) material that leaks very little current through a mechanism, which is called Fowler-Nordheim tunneling under voltage stress. Thin oxides that allow direct tunneling current behave differently than thicker oxides, which exhibit Fowler-Nordheim tunneling.

Conventional semiconductor fuses are capable of being programmed through application of a large current source to its poly-silicon layer. Such application of current causes the poly-silicon layer of the fuse to melt. Molten poly-silicon agglomerates towards both ends of the fuse. One of the disadvantages of this method is that the programmed fuse is prone to contamination.

Furthermore, such application of current decreases reliability of the programmed fuse and increases unpredictability of post-programming resistance of the fuse. This is also not compatible with sub-micron CMOS processing, which can tolerate a low programming voltage.

Therefore, there is a need for methods and systems that are capable of providing a reliable non-volatile one-time programming memory element. One-time programmable memory element should be compatible with sub-micron CMOS processing and provide predictable post programming resistance in the fuse.

BRIEF SUMMARY OF THE INVENTION

The present invention is directed to methods and systems for programming a memory cell. The invention utilizes a current mirror configuration having a first transistor and a second transistor, wherein the second transistor is coupled to the memory cell. Programming of the memory cell includes applying a voltage to the first transistor, whereby a first current is generated in the first transistor. A gate of the second transistor is coupled to the first transistor, whereby a second current is generated in the second transistor. The second current is proportional to the first current. The second current is provided to the memory cell, whereby the second current programs the memory cell.

Such application of current provides high repeatability and reliability as compared to conventional voltage based programming. The conventional voltage based programming requires relatively high voltages (>2.5V), which are incompatible with sub-micron CMOS technology. The present invention's systems and methods are less susceptible to electrostatic discharge damage of the fuse via input current source.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 7a is a top view of an example fuse in a memory cell.

FIG. 7b is a cross-sectional view of the example fuse in the memory cell shown in FIG. 7a.

FIG. 8b is a cross-sectional view of the fuse in the memory cell shown in FIG. 8a.

FIG. 9b is a flow chart diagram illustrating a method for selecting a memory cell during the programming method of FIG. 9a.

FIG. 9c is a flow chart diagram illustrating a method for verifying a memory cell step during the programming method of FIG. 9a.

FIG. 9d is a flow chart diagram illustrating a method for applying a current to a memory cell during the programming method of FIG. 9a.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE INVENTION

Table of Contents

Figure 1:
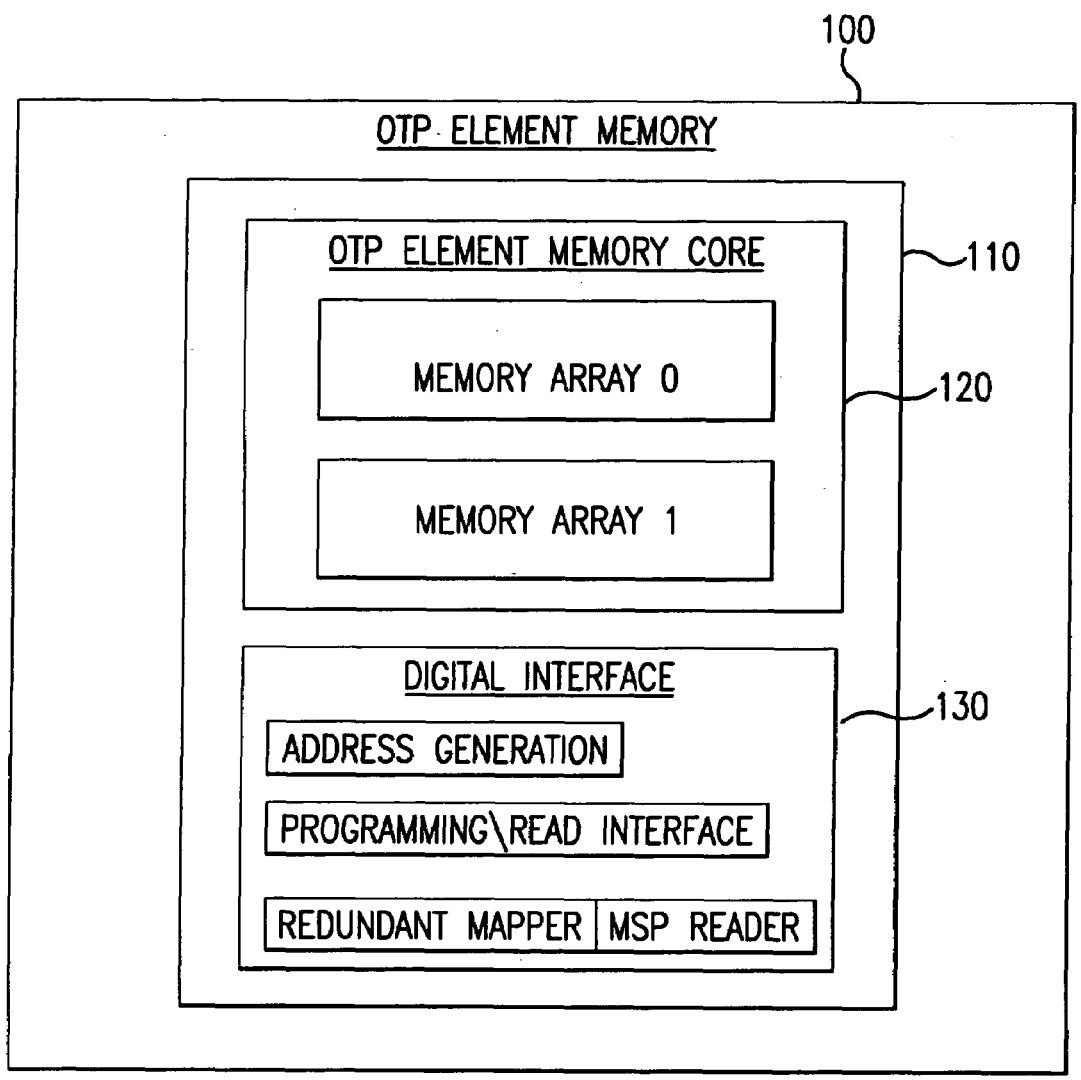
FIG. 1 is a block diagram of a one-time programmable element memory including a one-time programmable memory element core, according to the present invention.

1. Introduction.
2. One-Time Programmable (OTP) Memory Element—System Structure.
   a. OTP Memory Core.
   b. Row-column Matrix Memory Array Scheme.
   c. Address Decoder.
   d. Internal Timing Generator.
   e. Verification Circuit.
   f. PMOS Diode.
3. OTP Memory Element in-System Operation.
   a. Programming Mode.
   b. Reading Mode.
   c. Verification mode.
4. Poly-Si Fuse Design.
5. Conclusion.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of utility.

1. Introduction.

The present invention relates to semiconductor programmable elements. In particular, the present invention is directed to a one-time programmable ("OTP") memory element. OTP memory elements are also referred to herein as semiconductor fuses. Semiconductor fuses are used, for example, in non-volatile memory storage applications. The present invention also relates to poly-silicon fuses.

The semiconductor fuse is a device that provides a relatively low resistance when it is not programmed, and relatively high resistance when it is programmed. Conventional poly-silicon fuses are fabricated with a window opening, also known as fuse window, in a passivation layer (e.g., polyamide). The poly-silicon fuse can be P+ doped, N+ doped, or undoped. When a sufficiently high current is passed through the fuse, the fuse is heated up beyond its melting point. Therefore, a portion of a poly-silicon fuse under the fuse window will melt such that the molten poly-silicon material agglomerates towards one or both ends of the fuse.

There are several disadvantages of the above fusing method. The programmed fuse is prone to contamination through the passivation window opening. Secondly, a relatively high voltage is required to generate the high current necessary to melt poly-silicon fuse strips reliably. Such high voltage is not suitable for deep sub-micron CMOS processes (e.g., 0.13 μm CMOS processing, which tolerates a maximum of 2.5 V to 3.3 V). The application of high voltage can cause unintentional transistor gate oxide breakdown.

Conventional fusing typically limits programming such that end users are unable to program the fuses. Programming of the fuse is typically performed by applying a high voltage during wafer probe. Wafer probe occurs prior to packaging of the chip. Therefore, the end users of the final packaged product containing such a fuse are generally unable to program the fuses. Therefore, there is a need for methods and systems for one-time programmable memory that can be programmed on the final packaged product.

Yet another problem encountered in conventional fuses concerns programming reliability. Although a programmed or unprogrammed fuse generates an apparently proper voltage during a read cycle, the generated voltage may be near a reading threshold voltage. Changes in environmental conditions, changes in the fuse over time, and or changes in supply voltage and/or ground levels, may however, result in a programmed or unprogrammed fuse generating a voltage that no longer meets the reading threshold. Therefore, there is a need for methods and systems for one-time programmable memory that can be reliably programmed and read in the final packaged product independent of environmental conditions or changes in supply ground levels.

Figure 7B:
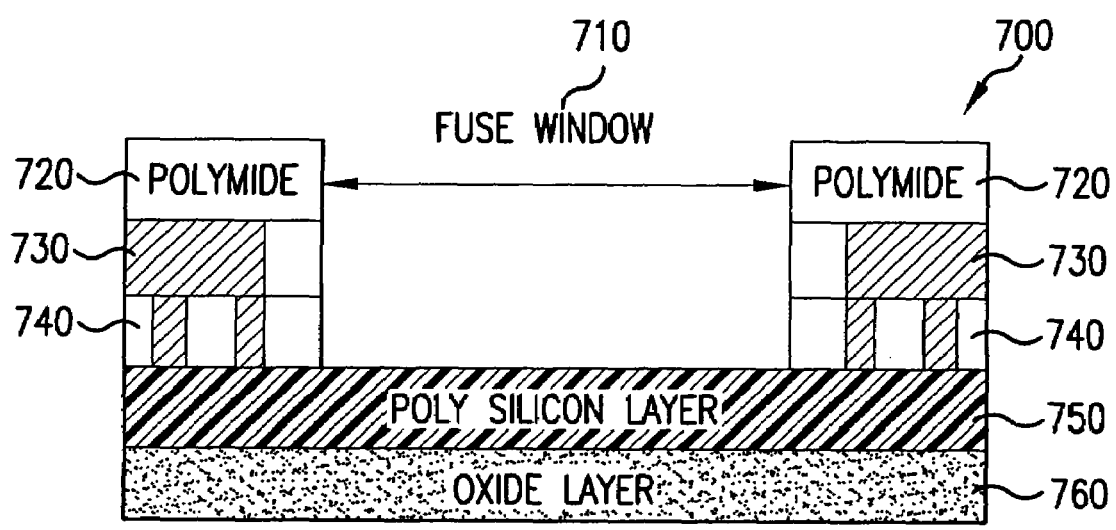

FIGS. 7a and 7b illustrate an example fuse 700, as described above. FIG. 7a illustrates a top view of the fuse 700. FIG. 7b illustrates a cross-sectional view of the fuse 700 taken at line A of FIG. 7a.

Referring to FIG. 7a, fuse 700 includes a fuse window 710, polyamide layers 720 and a poly-silicon layer 750. Poly-silicon layer 750 can be P+ doped, N+ doped, or undoped. An application of high voltage to the fuse generates current necessary to melt poly-silicon layer 750. The current necessary to melt poly-silicon layer 750 passes through fuse window 710.

FIG. 7b illustrates fuse window 710, polyamide layer 720, metal layer 730 and oxide layer 740, poly-silicon layer 750 and an oxide layer 760. Application of current to fuse 700 melts poly-silicon layer 750 to form a high resistance path between the metal layer 730 on the left side of fuse window 710 and the metal layer 730 on the right side of fuse window 710. The oxide layer 760 is generally not affected.

Figure 8A:
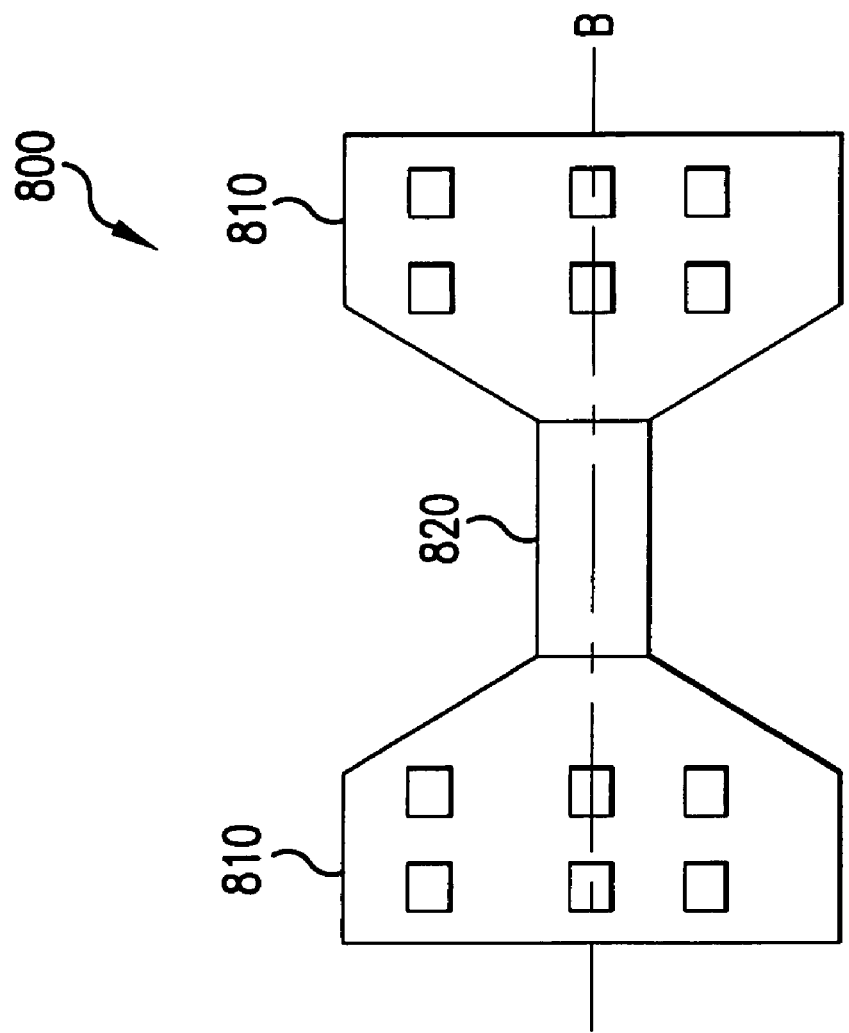
FIG. 8a is a top view of another embodiment of a fuse in the memory cell.
Figure 8B:
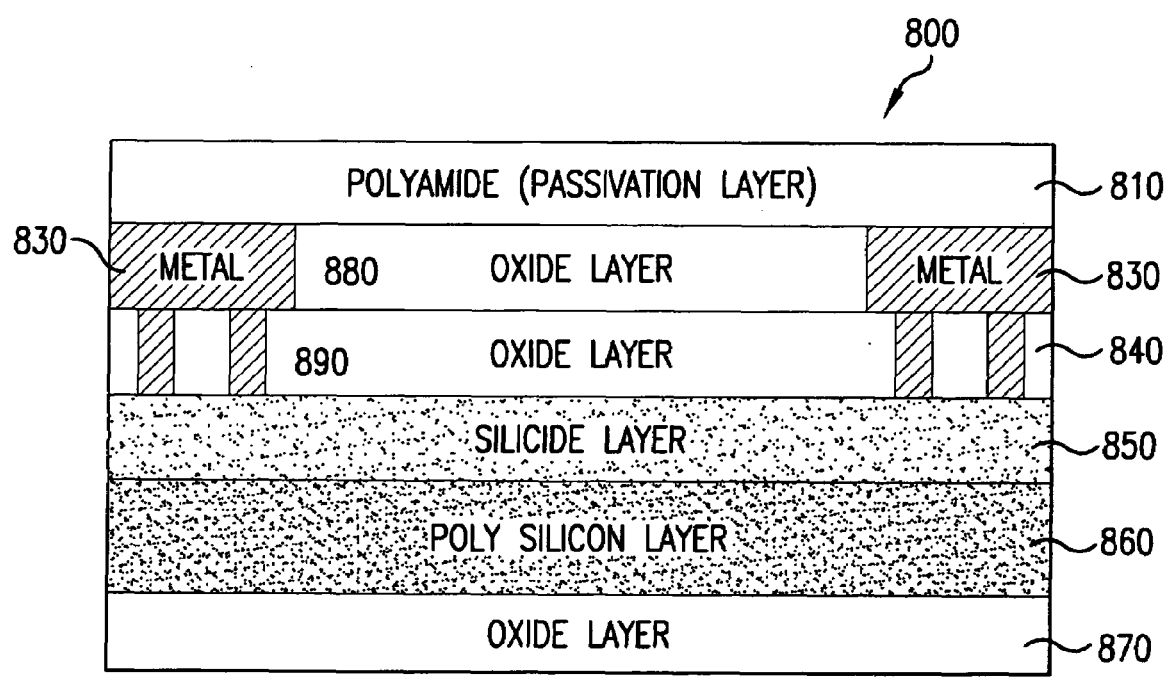

FIGS. 8a and 8b illustrate another example fuse 800. FIG. 8a illustrates a top view of the fuse 800. FIG. 8b illustrates a cross sectional view of the fuse 800 taken at line B. Fuse 800 eliminates the need to have a fuse window and allows fuse programming to be done at relatively low voltage in an embedded environment. Fuse 800 is sometimes referred to as a silicided poly-silicon fuse or a polycide fuse.

FIG. 8b illustrates fuse 800 having polyamide layer 810 (also referred to as passivation layer), metal layer 830 and oxide layer 840, silicide layer 850, poly-silicon layer 860, and an oxide layer 870. Normally, metal layers 830 conduct through poly-silicon layer 860 and silicide layer 850. Application of current to fuse 800 (i.e., to metal layer 830) melts silicide layer 850 to disrupt the conductive path through the poly-silicon layer 860 and silicide layer 850.

As compared to fuse 700, fuse 800 does not suffer from the relatively high programming voltage issue discussed above, because a much lower voltage is needed to generate a lower current for programming compared to fuse 700. However, both fuses 700 and 800 do not address the operational reliability in the fuse programming. To ensure that fuses can be used reliably in the actual non-volatile memory application, methods and systems to program, read and verify these fuses is needed, wherein verification uses thresholds that are more demanding than read thresholds.

2. One-Time Programmable (OTP) Memory Element—System Structure.

a. OTP Memory Core.

FIG. 1 is a block diagram of a one-time programmable ("OTP") element memory 100. OTP element memory 100 includes an OTP element memory core 120 and a digital interface 130. OTP element memory core 120 is coupled to digital interface 130. Digital interface 130 performs memory address generation, program access control, error correction by bit-remapping and manufacturing testing. Digital interface 130 also provides control data input to OTP element memory core 120.

Figure 2:
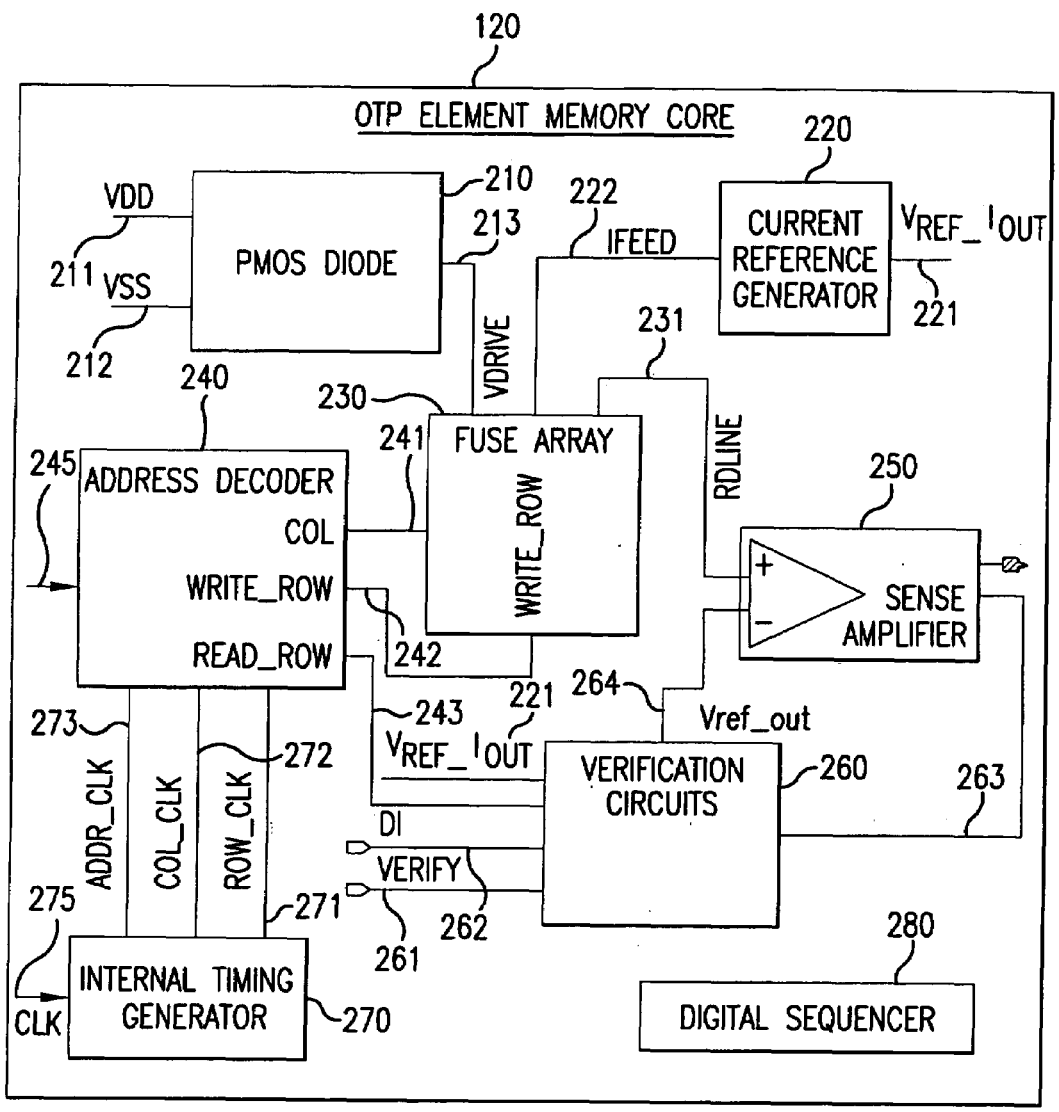
FIG. 2 is a block diagram of the one-time programmable element memory core according to the present invention.

FIG. 2 illustrates OTP element memory core 120 in more detail. OTP element memory core 120 includes a PMOS diode 210, a current reference generator 220, fuse array 230, an address decoder 240, a sense amplifier 250, verification circuits 260, an internal timing generator 270 and a digital sequencer 280.

PMOS diode 210 is coupled to fuse array 230. PMOS diode 210 generates a voltage VDRIVE 213 during an OTP element memory core 120 programming mode. This voltage is used to bias a gate of a current source transistor in an activated memory cell in fuse array 230 during OTP element memory core 120 programming mode.

Current reference generator 220 is coupled to fuse array 230 and verification circuits 260 and verification circuits 260. Current reference generator 220 provides currents to fuse array 230 during OTP element memory core 120 reading mode and verification mode. The currents are provided to activated or enabled memory cells in order to generate read voltages, such as RDLINE signal 231. Current reference generator 220 also supplies a current $V_{ref\_}I_{out}$ 221 to the verification circuits 260. $V_{ref\_}I_{out}$ 221 is an exact replica of an IFEED signal 222 (supplied to current reference generator 220), so that the verification circuits 260 can generate a VREF_OUT signal 264 that tracks RDLINE signal 231 voltages under changing supply conditions. A memory cell is activated or enabled when it is selected for programming or reading in OTP element memory core 120. The read voltages, such as RDLINE signal 231, indicate status of a memory cell in fuse array 230 after OTP element memory core 120 programming mode or during reading/verification modes. Current reference generator 220 also supplies current to sense amplifier 250.

Fuse array 230 includes a plurality of memory cells. In an embodiment, memory cells are arranged in a row-column matrix arrangement. Each memory cell can include a polycide fuse and a control circuit. In an embodiment, there can be 8 rows of 32-bit columns of memory cells. This provides 256 bits of memory represented by memory cells in fuse array 230. As would be understood by one skilled in the relevant art, other arrangements of memory cells within fuse array 230 are possible.

Address decoder 240 receives signals ROW_CLK 271, COL_CLK 272 and ADDR_CLK 273 from internal timing generator 270. In an embodiment, ROW_CLK 271, COL_CLK 272, and ADDR_CLK 273 are timing signals. These timing signals help to ensure that 8-bit input address signals 245 are properly latched on and stable in fuse array 230 before programming, reading or verification modes start. Based on these signals, address decoder 240 generates control signals that enable or activate a memory cell or fuse in fuse array 230.

Sense amplifier 250 is coupled to verification circuits 260 and fuse array 230. Sense amplifier 250 determines a state (e.g., programmed or unprogrammed) of the activated or enabled memory cell in fuse array 230. Sense amplifier 250 compares voltage RDLINE 231 generated by an enabled memory cell in fuse array 230 with a reference voltage VREF_OUT 264 generated by verification circuit 260. At least one sense amplifier is needed to operate the system. In an embodiment, if there are eight memory cells present in fuse array 230, there can be a sense amplifier 250 coupled to each of the eight memory cells in fuse arrays 230. In other words, because there are eight sense amplifiers 250 and RDLINE 231 is an 8-bit bus, the eight memory cells can be read at one time to form one byte (one byte equals to eight bits).

Verification circuits 260 are coupled to address decoder 240, and sense amplifier 250. Verification circuits 260 receive input digital signals 261 and 262, which are provided by digital interface 130 (not shown in FIG. 2). Verification circuits 260 provide one or more threshold voltages based on input digital signals 261 and 262. The threshold voltages are provided to the sense amplifier 250 for use verifying a status of a memory cell in fuse array 230 during programming, reading and/or verification modes.

Internal timing generator 270 is coupled to address decoder 240. Internal timing generator 270 controls timing for a fuse programming process (described below). Internal timing generator 270 ensures that the fuses in fuse array 230 are provided with a consistent current for programming over time. Internal timing generator 270 also ensures that the fuses in fuse array 230 are programmed with suitable repeatability.

Digital sequencer 280 controls timing of the programming, reading and verifying cycles of OTP element memory core 120. This ensures that ample time is given for each mode (programming, reading, and verification) to complete before allowing for the next mode to proceed. Digital sequencer 280 also re-times input digital signals from digital interface 130. Digital sequencer 280 times an actual memory cell programming period and a post-programming verification mode. This ensures that only a programmed memory cell is a "good quality" programmed memory cell. In an embodiment, the term "good quality", when used in reference to an unprogrammed memory cell, means that the unprogrammed memory cell has a low resistance and generates a low voltage, when a current is applied to it. In alternative embodiment, the term "good quality", when used in reference to a programmed memory cell means that a programmed memory cell has a high resistance and generates a high voltage, when a current is applied to it.

The following is a detailed description of the components and functions of OTP element memory core 120. As would be understood by one skilled in the relevant art, the OTP element memory core 120 is not limited to the components described herein.

b. Row-column Matrix Memory Array Scheme.

Figure 6:
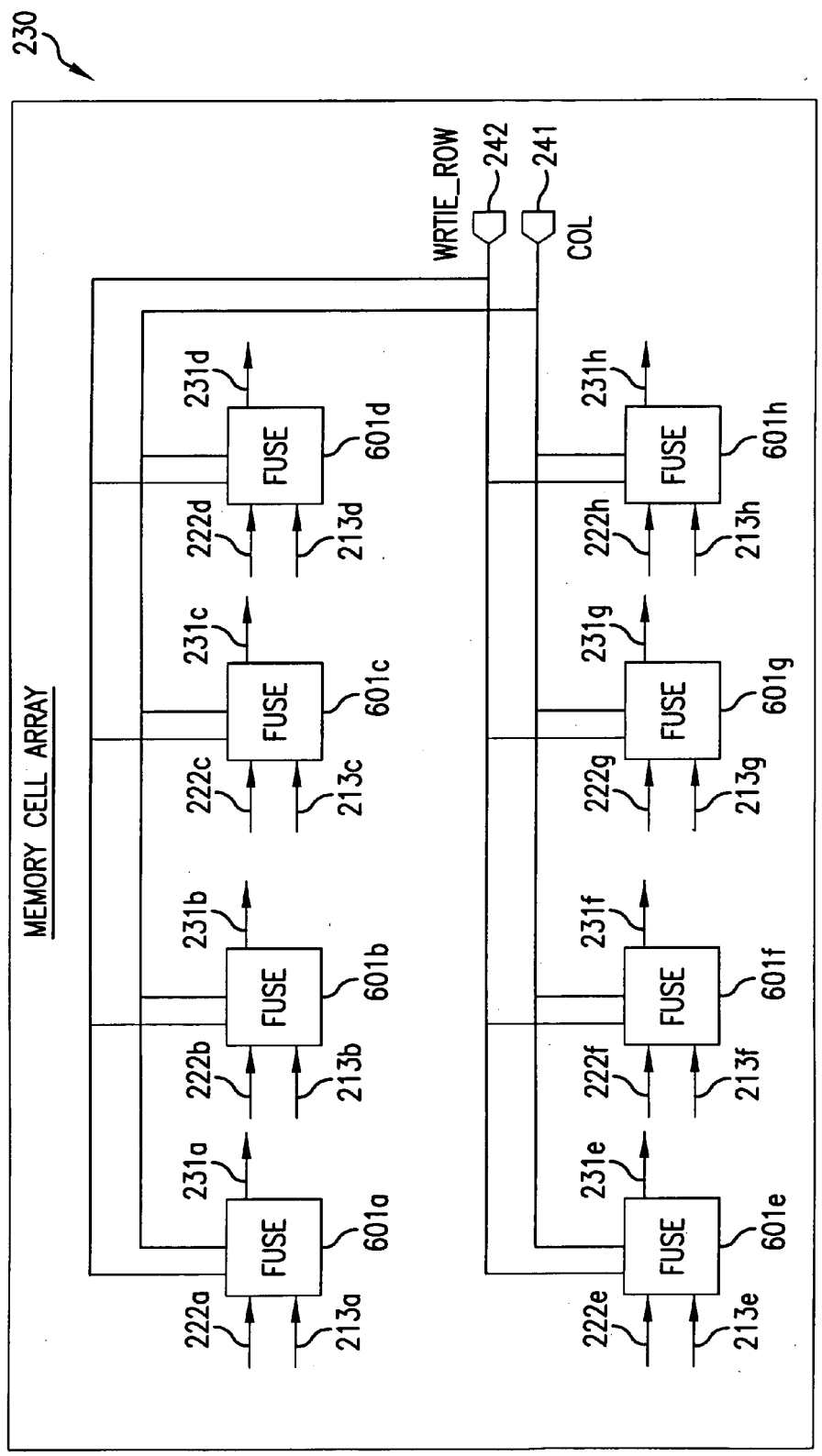
FIG. 6 is a block diagram of an example fuse array row-column matrix arrangement of the one-time programmable element memory core as shown in FIG. 2.

FIG. 6 illustrates a portion of an example row-column matrix embodiment of the fuse array 230. In the embodiment of FIG. 6, the fuse array 230 includes a plurality of fuses 601(a, b, c, d, e, f, g, h).

Input signals COL 241 and WRITE_ROW 242 select a memory cell or fuse 601 for programming. For example, COL 241 and WRITE_ROW 242 select fuse 601a. When fuse 601a is selected, OTP element memory core 120 can program or write to fuse 601a. READ_ROW 243 (FIGS. 2, 4) and COL 241 provide an ability to read and/or verify the fuse 601a. During the programming mode, for example, PMOS diode 210 (as shown in FIG. 2) applies a relatively constant current over a period of time to fuse 601a by providing a VDRIVE voltage signal 213 via a connector 213a in a current mirror configuration. The current applied through this current mirror configuration melts a poly-silicon layer of the fuse 601a. By applying a relatively constant current to fuse 601a, an opening is created in the fuse 601a's silicide and/or poly-silicon layers. Therefore, fuse 601a now has a relatively high resistance as compared to an unprogrammed fuse 601a, which has a relatively low resistance. A method of current application to fuse 601, during the programming mode, is described below.

During the reading mode, current reference generator 220 applies a read current IFEED 222 via a connector 222a to fuse 601a. When fuse 601a has been programmed, read current IFEED 222 via connector 222a encounters resistance of programmed fuse 601a. When the reading current is applied to programmed fuse 601a, a fuse voltage is generated. The fuse voltage depends on the resistance of the fuse. The fuse voltage is monitored via signal line RDLINE 231 via a connector 231a. The fuse voltage is fed into sense amplifier 250 via RDLINE 231. Based on voltage RDLINE 231, sense amplifier 250 determines whether fuse 601a is programmed or not.

FIG. 6 shows an example embodiment of an 8-bit row for a 256-bit memory cell bank. This allows for an efficient addressing and memory read and write access, because the same set of address lines (COL 241 and WRITE_ROW 242) and read lines (RDLINE 231) is shared among multiple fuses 601. Such sharing of COL 241 and RDLINE 231 allows a whole row of 8-bit cells to be selected together during a single read access, hence, shortening the total read time. This results in minimum routing of signals and allows more cells to be packed in a dense fashion without significant timing delay spreads. As would be understood by one having ordinary skill in the art, other embodiments of fuse array 230 are possible.

c. Address Decoder.

Figure 4:
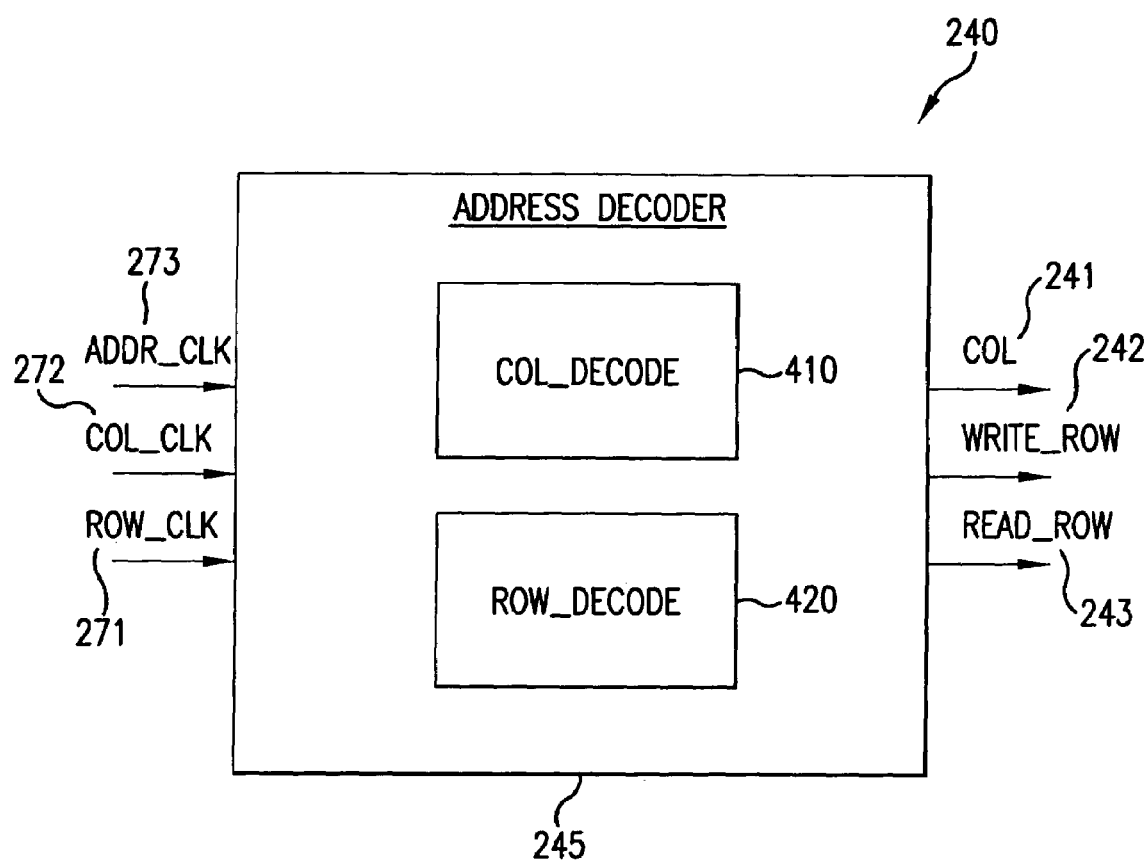
FIG. 4 is a block diagram of an example address decoder of the one-time programmable element memory core as shown in FIG. 2.

FIG. 4 is a block diagram of address decoder 240. Address decoder 240 includes a COL_DECODE block 410 and ROW_DECODE block 420. Address decoder 240 receives a plurality of addressing signals ROW_CLK 271, COL_CLK 272 and ADDR_CLK 273 from internal timing generator 270. Also, address decoder 240 receives input address signal 245 from digital interface 130. In an embodiment, input address signal 245 is an 8-bit digital signal. Input address signal 245 represents eight bits of addressing that are combined with addressing signals from internal timing generator 270.

Addressing signals ROW_CLK 271, COL_CLK 272 and ADDR_CLK 273 along with input address signal 245 are decoded by COL_DECODE block 410 and ROW_DECODE block 420. Resulting output signals COL 241, WRITE_ROW 242 and READ_ROW 243 define an address of a memory cell within fuse array 230.

COL 241 represents 32 column select bits. WRITE_ROW 242 represents eight row select bits. COL 241 and WRITE_ROW 242 select a fuse in the fuse array block 230 for programming mode. READ_ROW 243 signal represents eight row select bits for reading and verifying modes (described below).

As would be understood by one having an ordinary skill in the art, other embodiments of selecting a fuse in the fuse array block 230 are possible. The address decoder 240 of OTP element memory core 120 is not limited to the embodiment shown in FIG. 4.

d. Internal Timing Generator.

Figure 5A:
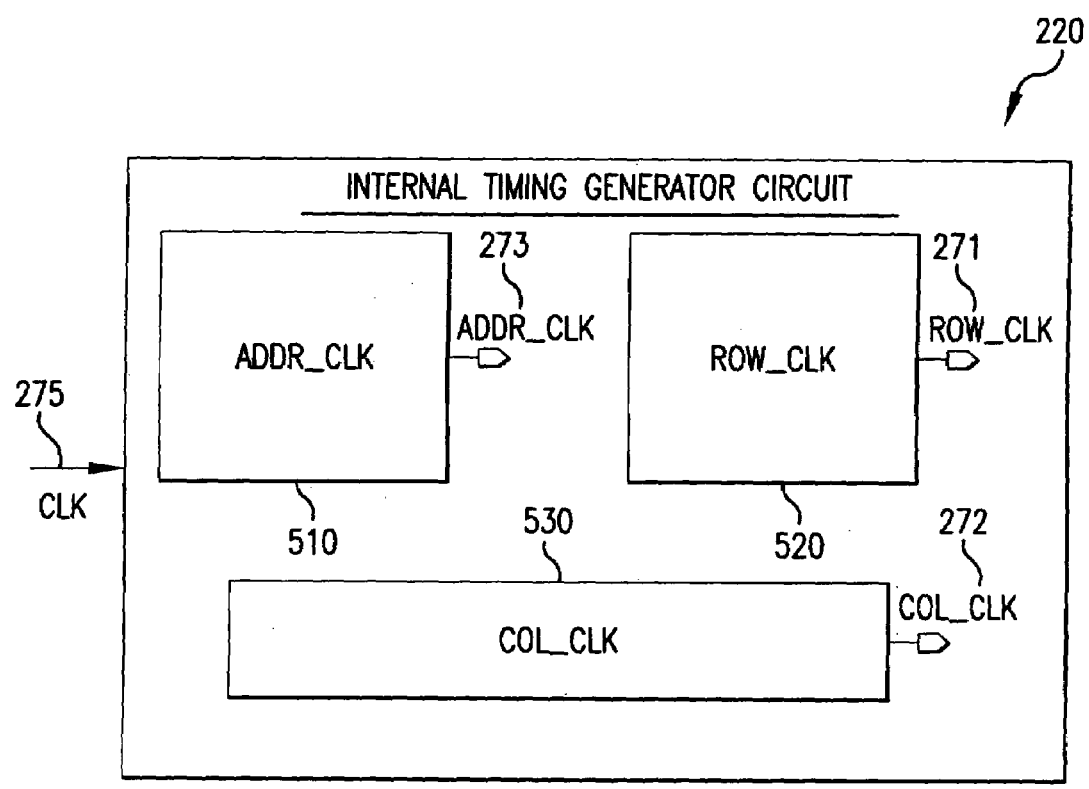
FIG. 5a is a block diagram of an example internal timing generator circuit of the one-time programmable element memory core as shown in FIG. 2.

FIG. 5a is a block diagram of internal timing generator 270. Internal timing generator 270 includes an ADDR_CLK signal generator 510, a ROW_CLK signal generator 520 and a COL_CLK signal generator 530.

Internal timing generator 270 receives an input signal CLK 275 from digital interface 130. The circuitry of internal timing generator 270 converts input signal CLK 275 through logic operations into ROW_CLK signal 271, COL_CLK signal 272 and ADDR_CLK signal 273. ROW_CLK 271, COL_CLK 272 and ADDR_CLK 273 are supplied to address decoder 240, which selects a fuse from fuse array block 230.

In an embodiment, internal timing generator 270 provides a highly repeatable way of selecting a memory cell within fuse array block 230 by providing sufficient time margins for programming, reading and verification modes. This makes operation of OTP element memory core 120 more robust against process, temperature and input signal supply variations. Furthermore, internal timing generator 270 ensures that programming mode and reading mode of a fuse in fuse array 230 are done with minimal disturbance. This is shown in a timing diagram in FIG. 5*b*.

Figure 5B:
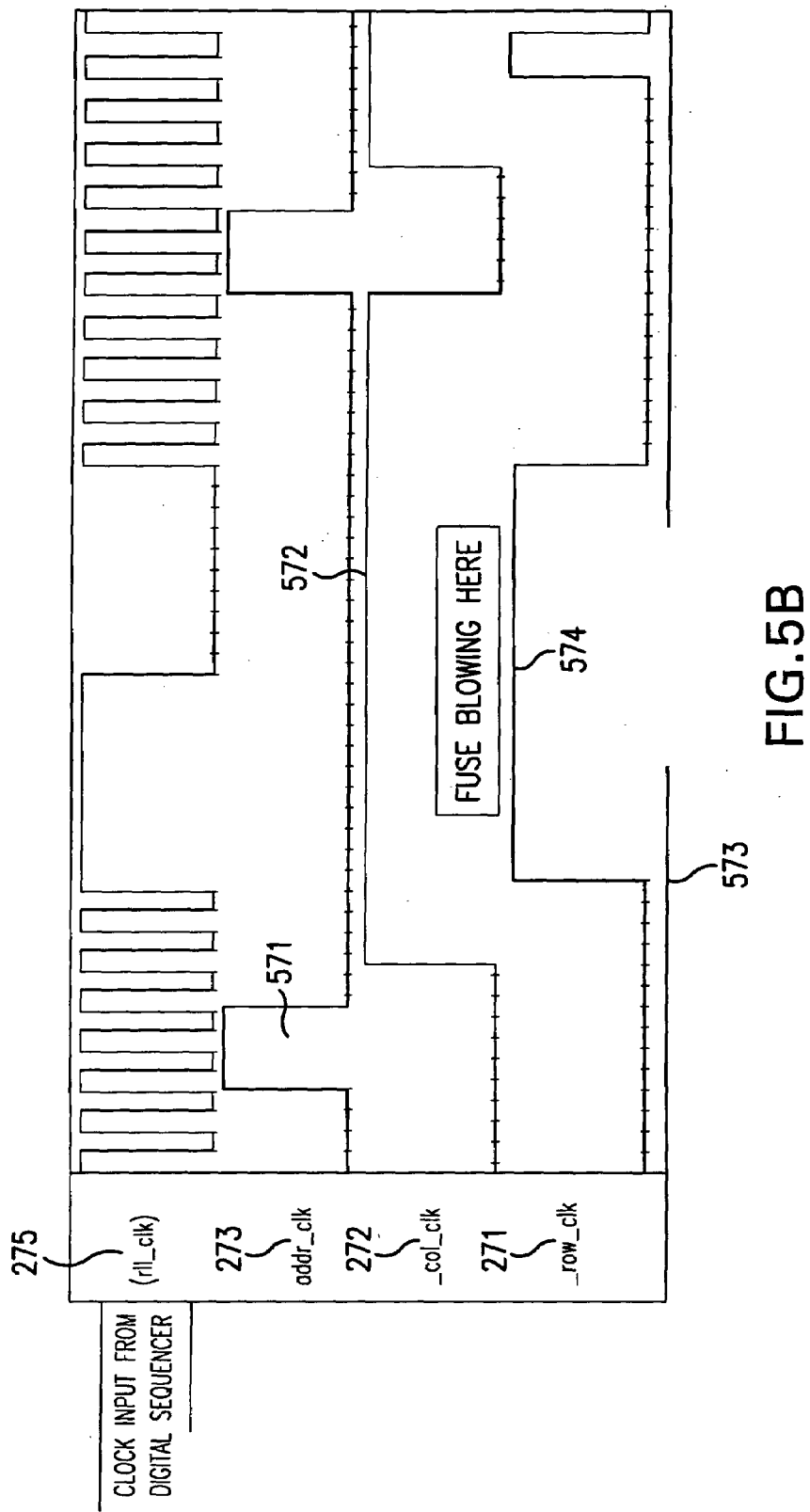
FIG. 5b is a timing diagram corresponding to an internal timing generator circuit shown in FIG. 5a, according to the present invention.

Referring to FIG. 5*b*, a time interval 571 in ADDR_CLK signal 273 time line corresponds to address input signal 245 being received by address decoder 240. This triggers COL signal 241 to select and enable a column of cells in fuse array 230 during a time interval 572 on ROW_CLK signal 271 time line. Fuse programming begins at a time 573 on COL_CLK signal 272 time line by having a programming current flow into a selected cell. The selected cell is programmed upon activation of WRITE_ROW signal 242 during a time interval 574 on COL_CLK signal 272 time line.

e. Verification Circuit.

Figure 10:
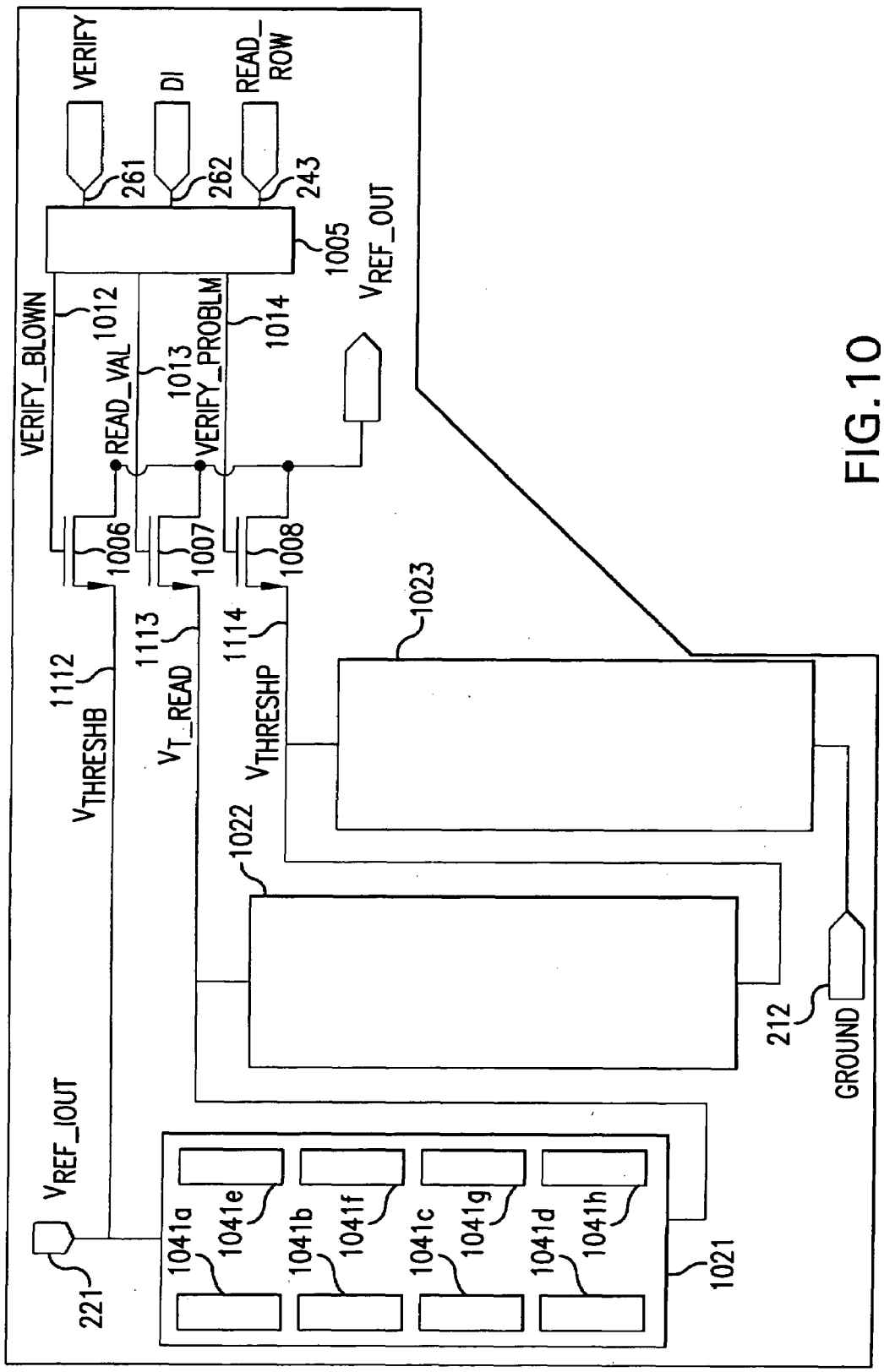
FIG. 10 is a block diagram of an example verification circuit of the one-time programmable element memory core as shown in FIG. 2.
Figure 11:
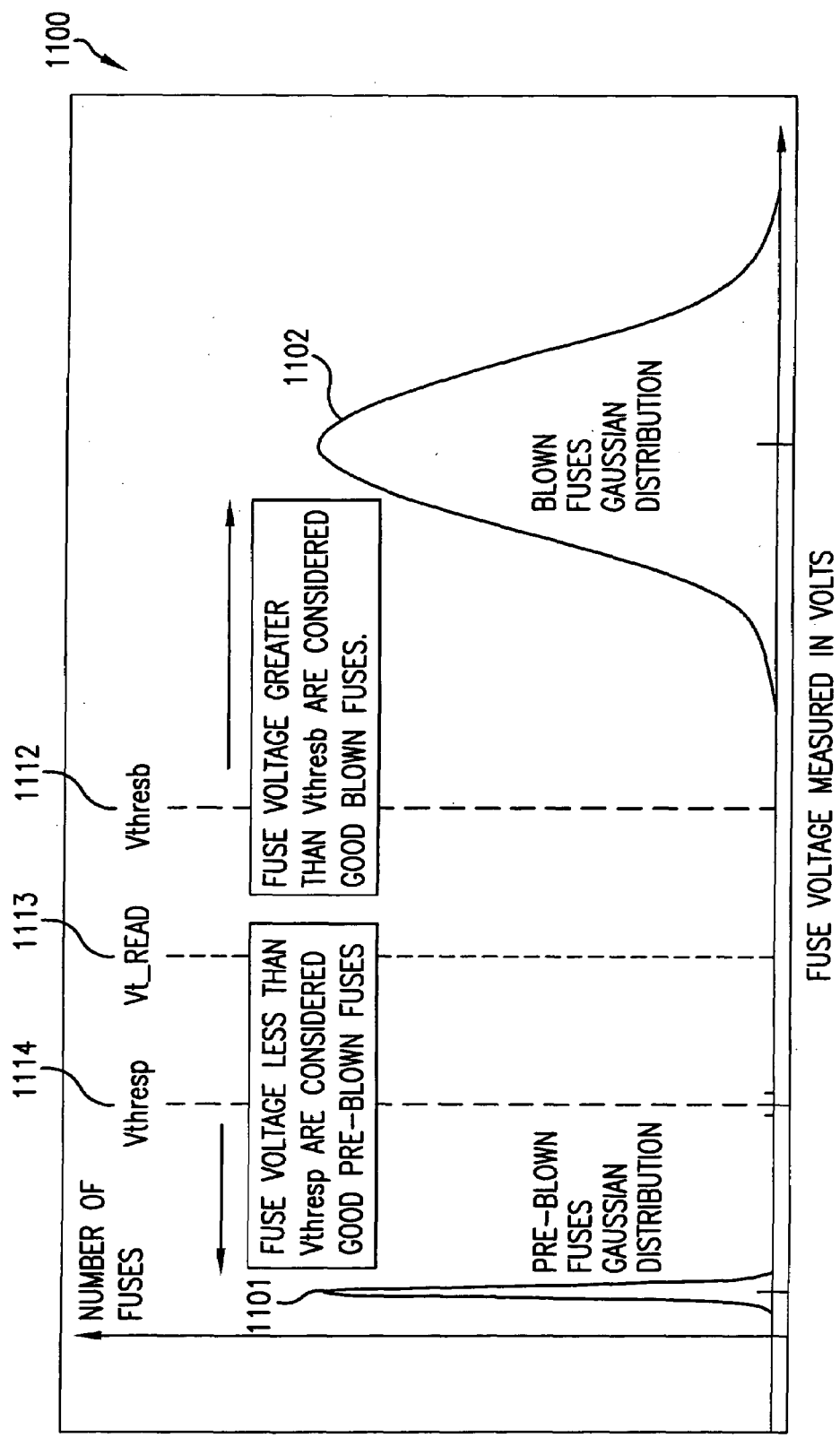
FIG. 11 is a Gaussian distribution of memory cell voltages generated during reading and verification modes of the one-time programmable element memory core shown in FIG. 2.

FIG. 10 is a block diagram of verification circuit 260. FIG. 11 is a diagram illustrating Gaussian distributions of fuse voltages and threshold voltages for a plurality of memory cells in fuse array 230 in verification mode.

OTP element memory core 120 implements reading and verifying of memory cells from fuse array 230 by controlling verification circuit 260. During the verification mode, the unprogrammed and programmed memory cells are compared against threshold voltages representing maximum and minimum verification threshold voltages generated by the memory core system, respectively. The maximum and minimum verification threshold voltages provide a more accurate threshold voltage standard as compared to the reading threshold voltage. In an embodiment, the maximum and minimum verification threshold voltages can be purposefully skewed. This means that maximum and minimum verification threshold voltages would represent maximum and minimum allowed thresholds, respectively. In another embodiment, the reading threshold voltage is between the maximum pre-programming threshold voltage and the minimum post-programming threshold voltage.

However, during the pre-programming verification mode, the unprogrammed fuse voltage must be less than the maximum pre-programming verification threshold voltage, if the unprogrammed fuse is to pass as a "good quality" unprogrammed fuse. In an embodiment, the term "good quality", when used in reference to an unprogrammed fuse, means that the unprogrammed fuse has a low resistance and generates a low voltage when a current is applied to it. In another embodiment, the term "good quality", when used in reference to a programmed fuse means that a programmed fuse has a high resistance and generates a high voltage, when a current is applied to it. The pre-programming verification mode is useful during production tests to ensure that the memory cells are of "good quality" before delivery to customers.

During the post-programming verification mode, the programmed fuse voltage must be greater than or equal to the minimum post-programming threshold voltage, if the programmed fuse is to pass as a "good quality" programmed fuse. In other words, the maximum pre-programming threshold voltage and the minimum post-programming threshold voltage can be purposefully skewed to generate a maximum and minimum allowed voltage threshold against which the unprogrammed and programmed fuses can be compared to insure their "good quality", respectively.

Verification circuit 260 includes a plurality of threshold modules 1021, 1022, and 1023. Gates of transistor switches 1006, 1007, and 1008 are coupled to digital verification circuitry 1005. Threshold modules 1021, 1022, and 1023 include one or more resistive circuits, such as unprogrammed and/or programmed fuses, in any of a variety of configurations. A current $V_{ref\_}I_{out}$ 221 is applied to the threshold modules 1021, 1022 and 1023, thereby generating voltage thresholds $V_{threshp}$, VT_READ, and $V_{threshb}$, respectively. The current flowing into $V_{ref\_}I_{out}$ 221 is a substantial replica of IFEED current 222 (not shown in FIG. 10).

Signals VERIFY 261 and DI 262 serve as digital inputs from digital interface 130 (as shown in FIG. 1). Signal READ_ROW 243 from address decoder 240 (shown in FIG. 2) is another input signal to digital verification circuitry 1005. These signals supply input signals to digital verification circuit 1005. Based on the input signals, digital verification circuit 1005 generates voltage signals VERIFY_BLOWN 1012, READ_VREF 1013, and VERIFY_PREBLOWN 1014. Signals 1012, 1013 and 1014 control transistor switches 1006, 1007, and 1008, respectively, to provide one of the voltage thresholds at the output terminal VREF_OUT 264, depending upon a mode of operation as described below.

During the verification mode of an unprogrammed fuse signal VERIFY_PREBLOWN 1014 applies to transistor switch 1008 to close it. Therefore, voltage signal $V_{threshp}$ passes through transistor switch 1008 to the output terminal VREF_OUT 264.

During the reading mode of a programmed or unprogrammed fuse, signal READ_VREF 1013 applies to transistor switch 1007 to close it. Therefore, signal VT_READ passes to the output terminal VREF_OUT 264 of the verification circuit 260.

During the verification mode of a programmed fuse, signal VERIFY_BLOWN 1012 is applied to transistor switch 1006 to close it. Therefore, signal $V_{threshb}$ passes to the output terminal VREF_OUT 264 of the verification circuit 260.

FIG. 11 shows fuse voltage distribution as compared against threshold voltages generated by threshold modules 1021, 1022, and 1023. As shown in the embodiment of FIG. 11, $V_{threshp}$ 1114 is less than VT_READ 1113 and VT_READ 1113 is less than $V_{threshb}$ 1112. As would be understood by one having ordinary skill in the art other reference voltage distributions are possible.

During the verification mode, one of transistor switches 1006 and 1008 are switched on, depending on whether a programmed or an unprogrammed memory cell is being verified. Verification circuit 260 is used during pre-programming phase of the programming mode and during post-programming phase of the programming mode. In the pre-programming phase, OTP element memory core 120 determines whether the selected memory cell 601 (as shown in FIG. 6) is a "good quality" memory cell. When the circuit 260 enters the verification mode, a current is applied to the unprogrammed memory cell 601 to generate a fuse voltage. The fuse voltage should be low enough to pass the "good quality" cell standard (as described above).

In the post-programming phase, OTP element memory core 120 determines whether the programmed memory cell 601 is a "good quality" programmed memory cell. When the circuit 260 enters the verification mode, a current is applied to the programmed memory cell 601 to generate a fuse voltage. The fuse voltage should be high enough to pass the "good quality" programmed cell standard (as described above).

In an embodiment, the threshold modules are implemented with fuses that can be similar to the fuses in the fuse array 230. Resistance of each such fuse can vary. In an embodiment, fuses within the threshold modules are preferably arranged to average the resistance of the fuses.

In an embodiment, threshold modules 1021, 1022 and 1023 include an array of fuses connected in series-parallel arrangement. For example, threshold module 1021 is illustrated with eight unprogrammed fuses 1041(*a, b, c, d, e, f, g, h*). Fuses 1041*a*, 1041*b*, 1041*c*, and 1041*d* are connected in series. Fuses 1041*e*, 1041*f*, 1041*g*, and 1041*h* are also connected in series. Series connected fuses 1041(*a, b, c, d*) are connected in parallel to series connected fuses 1041(*e, f, g, h*). Such arrangement of unprogrammed fuses 1041(*a–h*) provides an averaging of fuse resistances. Therefore, a final resistance of threshold module 1021 is $$\frac{1}{R_{1021}} = \frac{1}{R_{1041a} + R_{1041b} + R_{1041c} + R_{1041d}} + \frac{1}{R_{1041e} + R_{1041f} + R_{1041g} + R_{1041h}} \quad (1)$$

If the resistance of each fuse 1014 is equal to R, then $R_{1021}$ is equal to 2R. As would be understood by one having ordinary skill in the art, other embodiments of verification circuit 260 along with threshold modules 1021, 1022, and 1023 are possible. The threshold modules 1021, 1022, and 1023 are not limited to the embodiment shown in FIG. 10. There can be any number of fuses and/or other resistive devices within threshold modules 1021, 1022, and 1023. Using fuses similar to the fuses 601 and having the current flowing into $V_{ref\_}I_{out}$ 221 substantially equal or proportional to IFEED 222 by generating the currents for Vref_Iout 221 and IFEED 222 using matched bias circuitry (not shown in FIG. 10), provides advantages such as tracking of process, voltage and temperature variations.

Referring to FIG. 11, after the fuse has been programmed, OTP element memory core 120 confirms that it was programmed by entering into the verification mode. In the verification mode, current is applied to programmed fuse 601 to generate the fuse voltage that will be compared against the $V_{threshb}$ 1112 generated by signal verification circuit 260 at output terminal VREF_OUT 264 (FIG. 10). When the fuse voltage generated by fuse 601 is greater than the $V_{threshb}$ 1112, fuse 601 is considered programmed. If the fuse voltage generated by fuse 601 is less than $V_{threshb}$ 1112, fuse 601 is considered not good quality.

In order to verify that an unprogrammed fuse in fuse array 230 is a "good quality" fuse, OTP element memory core 120 enters the verification mode where a current is applied to the unprogrammed fuse to generate a pre-programmed voltage. Then, OTP element memory core 120 compares fuse's pre-programmed voltage to voltage $V_{threshp}$ 1114. Voltage $V_{threshp}$ 1114 is generated by threshold module 1023 of verification circuit 260, as described in FIG. 10. Since the current applies to the unprogrammed fuse having a low resistance, the fuse generates a low voltage signal. If the low voltage signal is less than $V_{threshp}$ 1114, then the fuse is a "good quality" fuse and can be programmed, if desired. If the low voltage signal is more than $V_{threshp}$ 1114, then the fuse is not a "good quality" fuse and will not be programmed (as described above).

In order to verify that the fuse was properly programmed, a current is applied to the programmed fuse to generate a post-programming voltage. Then, OTP element memory core 120 compares the programmed fuse's post-programming voltage to voltage $V_{threshb}$ 1112. Voltage $V_{threshb}$ 1112 is generated by threshold module 1021 of verification circuit 260. Since the current applied to the programmed fuse has a high resistance, the fuse will generate a high voltage signal. If the high voltage signal is greater than $V_{threshb}$ 1112, then the fuse is a "good quality" programmed fuse. If the high voltage signal is less than the $V_{threshb}$ 1112, then the programmed fuse is not a "good quality" programmed fuse. In other words, the programmed fuse passes the verification test when its fuse voltage is greater than $V_{threshb}$ 1112. If the fuse voltage is less than $V_{threshb}$ 1112 then the programmed fuse does not pass the verification test. Note that this verification test/mode can be either initiated automatically after a fuse is programmed or it can be initiated independently.

Gaussian distribution 1100 illustrates unprogrammed fuse voltage distribution curve 1101 and post-programmed fuse distribution curve 1102. Curve 1101 and curve 1102 represent fuse voltages for the plurality of fuses within fuse array 230 of FIG. 2.

The following Table 1 summarizes concepts described above in conjunction with FIGS. 10 and 11 with respect to reading and verification modes. More particularly, Table 1 illustrates Verification and Reading modes that are used to check fuse quality and normal read back, respectively (Logical HIGH indicates presence of a signal; logical LOW indicates absence of signal).

TABLE 1

| Mode | DI 262 | VERIFY 261 | Resulting VREF_OUT 264 | Fuse Pass Criteria |
|---|---|---|---|---|
| VERIFY_BLOWN 1012 | HIGH | HIGH | $V_{threseshb}$ 1112 | Fuse Voltage $\geq V_{tthreshb}$ |
| READ_VREF 1013 | N/A | LOW | VT_READ 1113 | N/A: READ_VREF is used for normal memory read cycle. Fuse Voltage > VT_READ implies fuse memory state is HIGH. Fuse Voltage < VT_READ implies fuse memory state is LOW. |
| VERIFY_PREBLOWN 1014 | LOW | HIGH | $V_{threshp}$ 1114 | Fuse Voltage $\leq V_{threshp}$ |

Referring to the first row of Table 1, during the verification of a programmed memory cell the current is applied to the programmed memory cell based on digital input signals DI 262 and VERIFY 261 from digital interface 130. As a result, the programmed memory cell generates a fuse voltage. The fuse voltage should be relatively large, because memory cell is programmed and has a high resistance. The fuse voltage is compared against $V_{threshb}$ 1112. If the fuse voltage is greater than or equal to $V_{threshb}$ 1112, then the programmed memory cell passes the verification test, as indicated in Table 1.

During the verification of an unprogrammed memory cell a current is applied to the unprogrammed memory cell. As a result, the unprogrammed memory cell generates a fuse voltage. The fuse voltage should be relatively small, because the memory cell is not programmed and has a low resistance. The fuse voltage is compared against $V_{threshp}$ 1114. If the fuse voltage is less than or equal to $V_{threshp}$ 1114, then the programmed memory is a "good quality" memory cell, i.e., passes the verification test for unprogrammed memory cell, as indicated in the third row of Table 1.

Referring to the second row of Table 1, during the reading mode, the verification circuit 260 generates voltage VT_READ 1113. In the reading mode, the current is applied to a programmed memory cell to generate a voltage. That voltage is compared against VT_READ 1113. As indicated in Table 1, if the programmed memory cell generates a voltage that is above VT_READ 1113, then the memory cell is programmed. If the programmed memory cell generates a voltage that is below VT_READ 1113, then the memory cell is not programmed.

The verification mode ensures that programmed and unprogrammed memory cells generate voltages that are well above or below the reading threshold voltages, respectively. This helps to ensure that a "good quality" memory cell is selected for programming and that a programmed memory cell passes the verification test. In other words, the verification mode ensures that the selected memory cell can always be read reliably by OTP element memory core 120 to indicate the correct programmed or unprogrammed state, regardless of time, temperature and other surrounding conditions. The verification circuit generates a set of more accurate threshold voltages against which fuse voltages are compared in appropriate modes. When fuse voltages fall within limits set by the threshold voltage, the fuse is assured of its good quality.

f. PMOS Diode.

Figure 3A:
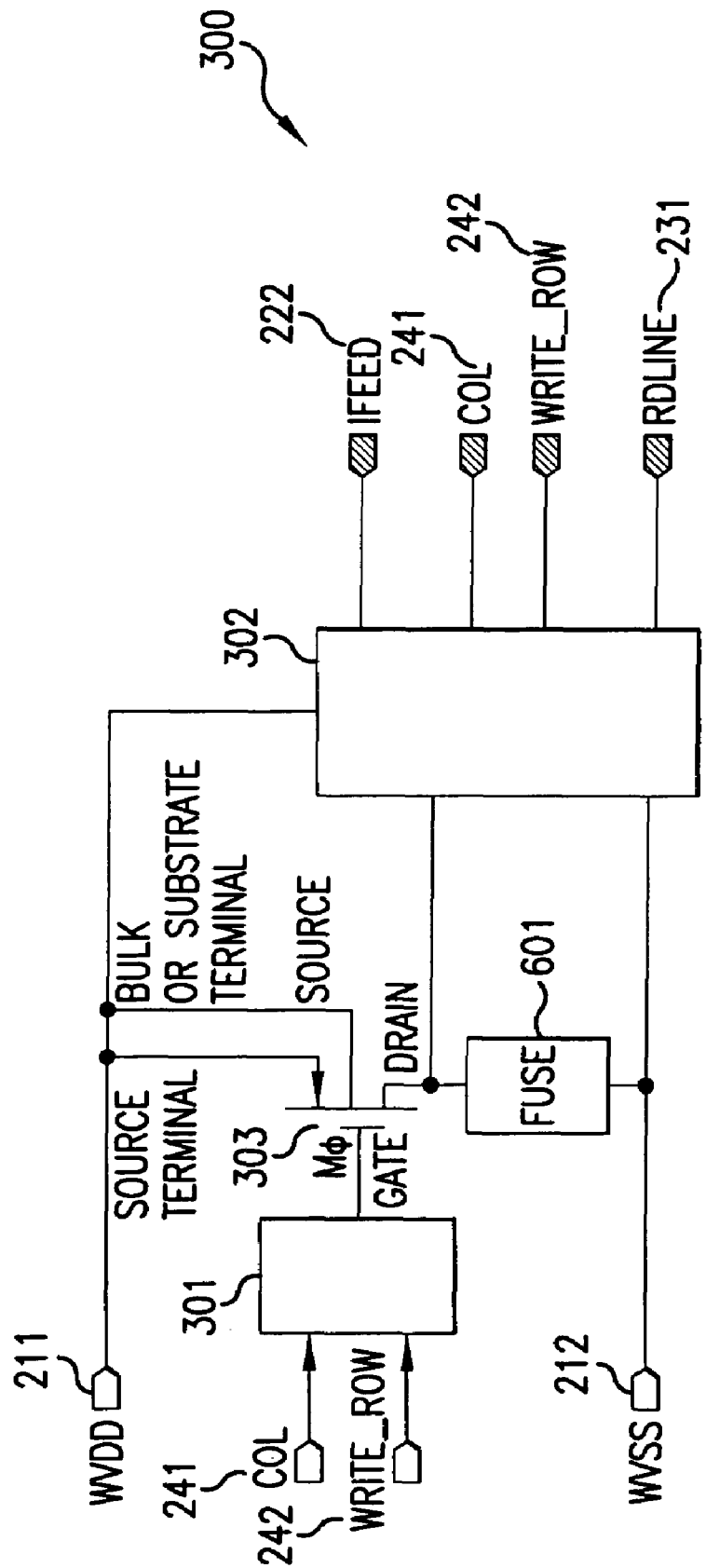
FIG. 3a is a block diagram of a conventional system for programming a memory cell.
Figure 3B:
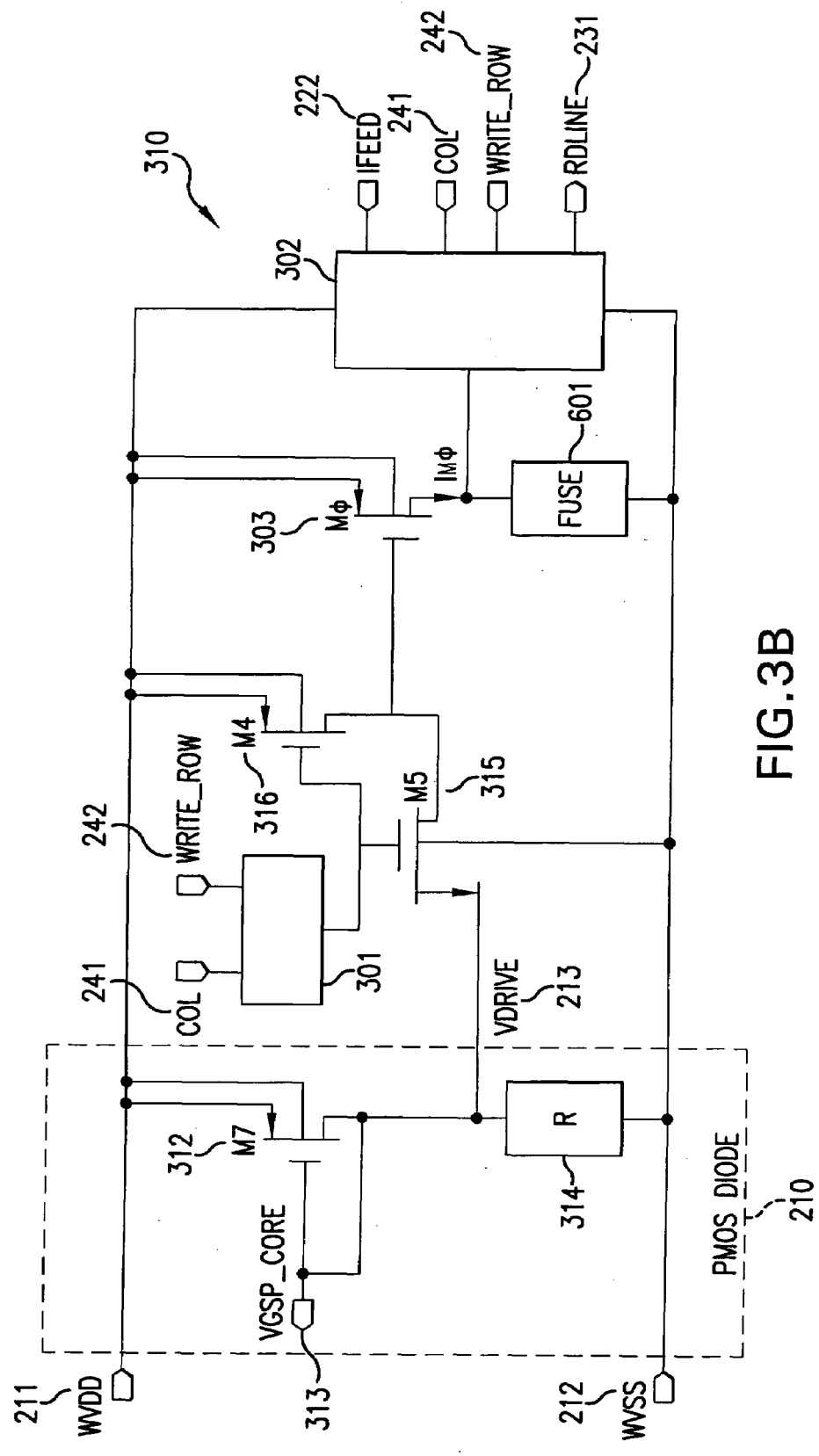
FIG. 3b is a block diagram of a system for programming a memory cell, according to the present invention.

FIG. 3a is a block diagram of a fuse programming system 300 for programming fuse 601. FIG. 3b is a block diagram of a fuse programming system 310 for programming fuse 601, according to an embodiment of the present invention.

In FIG. 3a, the fuse programming system 300 includes a transistor switch M0 303, fuses selection circuit 301 and a reading circuit 302. Power supply terminals 211 and 212 apply voltage to the programming system 300. Signals COL 241 and WRITE_ROW 242 originally select fuse 601 for programming via fuse selection circuit 301. Fuse 601 is coupled between power supply terminals 211 and 212. Once fuse 601 is selected, a programming current is applied via transistor M0 303. Application of a control voltage at the gate of transistor M0 303, by fuse selection circuit 301, allows the programming current to pass through the fuse 601. The programming current passes through fuse 601 from power supply terminal 211 to the ground 212. Such application of current melts the fuse's poly-silicon/silicide layer. In conventional systems, the programming current is relatively large, which renders the molten poly-silicon layer unstable. This means that the poly-silicon may reseal itself and return the fuse to the initial unprogrammed state, or sometime in between. Also, the programming voltage applied to the fuse to program it is relatively high for the 0.13 μm CMOS process technology. Therefore, there is a need for an improved methods and systems for programming fuses.

FIG. 3b is a block diagram of an improved fuse programming system 310 for programming fuse 601. System 310 includes PMOS diode 210, fuse selection circuit 301, transistors M5 315, M4 316, and reading circuit 302. Transistor M0 303 forms a current mirror configuration with PMOS diode 210. PMOS diode 210 includes a transistor M7 312 with gate and drain nodes connected together.

System 310 includes a current mirror configuration involving transistors M7 312 and M0 303. System 310 applies a constant amount of current, through the current mirror configuration, to fuse 601. The amount of current is determined based on the voltages applied via power supply terminals 211 and 212, as well as a voltage, VGSP_CORE 313. VGSP_CORE voltage 313 is used to bias the gate of current source transistor M0 303, when fuse 601 is selected for programming. The following equation determines an amount of current passing through transistor M0 303 and applying to fuse 601 during the programming mode:

$$(V_{VGSP\_CORE} - V_{WVSS})/R = n*I_{M0} \quad (2)$$

wherein $V_{WVSS}$ is the voltage at the power supply terminal 212, $V_{VGSP\_CORE}$ is the bias voltage of transistor M7 312, R is a value of resistance R 314, and n is a constant value that depends upon properties of transistors M7 312 and M0 303. For example, n depends upon the relative physical dimensions of these two transistors. In an embodiment, resistance R varies, according to the size and length of a connector connecting ground WVSS 212 and transistor M7 312.

When fuse 601 is selected for programming, transistor M5 315 turns on connecting signal VDRIVE 213 to the gate of transistor M0 303. As a result, transistor M0 303 turns on. Because VDRIVE 213 is connected to the gate of M0 303, VDRIVE 213 applies a constant amount of voltage to the gate of M0 303. This way PMOS diode 210 controls the amount of current that flows through transistor M0 303 and to the fuse 601. Because of the current mirror configuration, the amount of current that flows through transistor M7 312 is proportional to the amount of current that flows through transistor M0 303. For example, the currents will be substantially equal to one another if the physical dimensions of M7 312 and M0 303 are substantially identical. If sized differently, then the current in M0 303 will be scaled proportionally to the current in M7 312 by a factor determined by the physical dimensions of these transistors. The value of resistance R 314 can be used to influence the amount of current that flows through transistor M7 312.

Using PMOS diode 210 and current mirror configuration of transistors M7 312 and M0 303, fuse 601 can be programmed to high-resistance without a danger of fuse's poly-silicon/silicide layer re-flowing back to its original configuration. Application of optimal current $I_{M0}$ melts fuse 601 poly-silicon/silicide layer in the center, which creates an open circuit in the poly-silicon/silicide layer of fuse 601.

As would be understood by one having ordinary skill in the art, current $I_{M0}$ can be adjusted to different levels in order to give a highest programming yield. Furthermore, the PMOS diode 210 configuration is shared among different memory cells within row-column matrix of fuse array 230 (not shown in FIG. 3b)

In an example embodiment, such constant current programming provides high repeatability and reliability as compared to conventional voltage based programming. The conventional voltage based programming requires high voltages (>2.5V), which are incompatible with sub-micron CMOS technology. Programming in accordance with the present invention is less susceptible to electrostatic discharge damage of the fuse via power supply terminal WVDD 211.

Figure 3C:
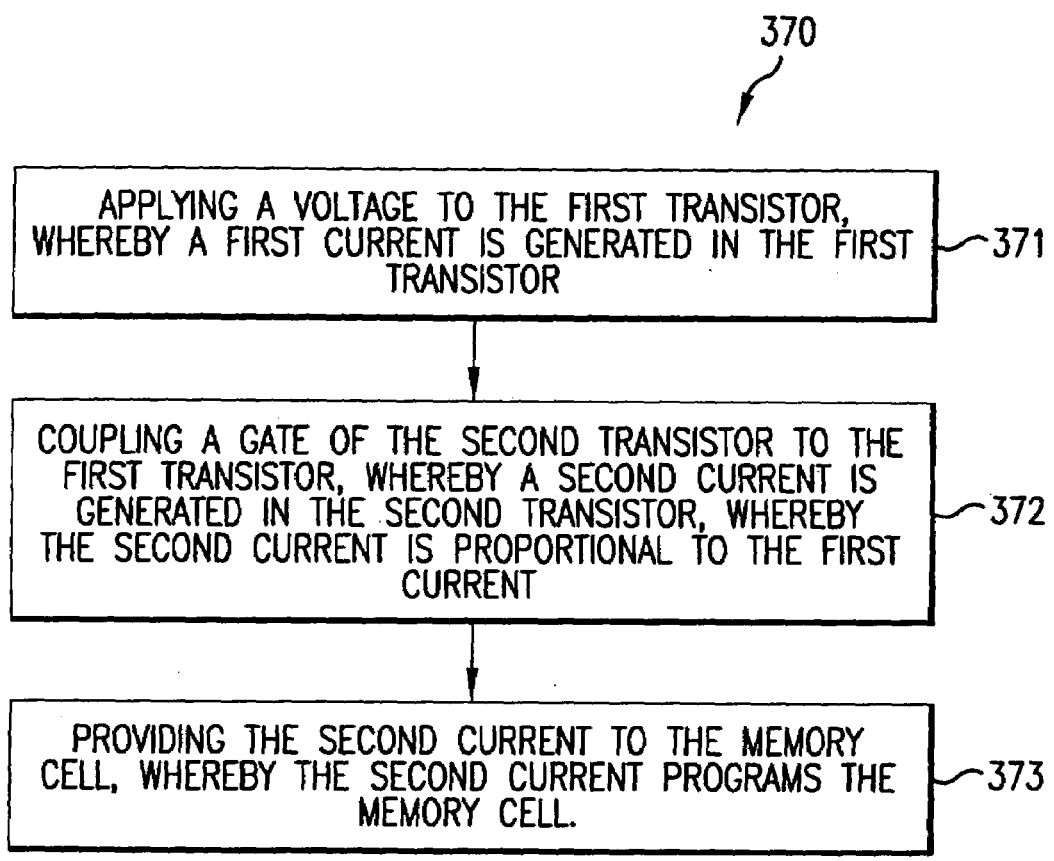
FIG. 3c is a flowchart diagram illustrating a method of current application to a memory cell, according to the present invention.

The following is a description of a method of current application to fuse 601 during the programming mode. FIG. 3c is a flowchart diagram of a method 370 describing application of current to fuse 601.

In step 371, system 310 applies a voltage to first transistor M7 312 in the current mirror configuration and a first current is generated in transistor M7 312. The voltage is applied from power supply terminal WVDD 211. Transistor M7 312 and resistance R314 operate together as a bias circuit. Together they divide the voltage applied from power terminal WVDD 211 and ground WVSS 212 to generate a bias voltage VDRIVE 213 (VGSP_CORE 313). A first current is generated in transistor M7 312 which is equal to a potential voltage difference (voltage between the bias voltage VDRIVE 213 and ground WVSS 212) divided by a resistance (the resistance value of resistance R314). The value of the bias voltage VDRIVE 213 depends upon several factors. These factors include the resistance value of resistance R314, the electrical characteristics of transistor M7 312, and the voltage potential between power terminal WVDD 211 and ground WVSS 212.

In step 372, the gate of the second transistor in the current mirror, M0 303, is coupled to the first transistor, M7 312. Signals COL 241 and WRITE_ROW 242 turn on transistor M5 315, if fuse 601 is selected for programming. This allows voltage bias from VDRIVE 213 to be coupled directly through transistor M5 315 onto the gate of transistor M0 303, thus coupling the first transistor M7 312 to the second transistor M0 303 in the current mirror. The source terminals of both the first and second transistors, M7 312 and M0 303, are connected to the same power terminal WVDD 211. By coupling the gate voltage of M0 303 to the VDRIVE 213 voltage, this causes the same voltage potential across the gate-source terminals of transistor M0 303 as across the gate-source terminals of transistor M7 312. Consequently transistor M0 303 turns on to allow a second current to flow through the transistor M0 303 which is proportional to the first current in transistor M7 312. This proportional current is referred to herein as a controlled current.

In step 373, the controlled current is provided to fuse 601, for a controlled period of time, which programs the fuse 601.

This method allows for a continuous and controlled application of current to fuse 601.

3. OTP Memory Element in-System Operation.

There are several modes of operation of OTP element memory core 120 in the present invention. These are programming, reading and verification modes. In the programming mode, the system identifies a memory cell for programming and programs it. During the programming mode, the fuse contained in the identified memory cell is blown or fused. In other words, selected memory cell changes its state from low resistance to high resistance.

After the fuse is programmed, the system can go into the verification mode. In an embodiment, the system can automatically switch to the verification mode. In an alternative embodiment, a user can switch the system into the verification mode. In the verification mode, the system determines whether the fuse in the selected memory cell was programmed or not. The system's components involved in the verification mode apply current to the fuse to generate a fuse voltage.

In an embodiment, a user can switch the system to the verification mode. In an alternative embodiment, the system can automatically switch to the verification mode immediately after a fuse is programmed during the programming mode. In the verification mode, the system performs a comparison between fuse voltage and minimum and maximum threshold voltages. The minium threshold voltage serves when verifying an unprogrammed fuse. Whereas, the maximum threshold voltage serves when verifying a programmed fuse. The minimum and maximum threshold voltages are determined by the system or the user. Verification mode's purpose is to guarantee quality of the fuse selected for programming, as well as, guarantee that the fuse is properly programmed.

The verification mode involves the verification circuit. The verification circuit compares the voltage applied to fuse in the selected memory cell to a threshold voltage generated by the verification voltage. Upon voltage comparison, the verification circuit ensures reliable programming of the fuse.

Reading mode is a mode where a user retrieves memory contents of the selected cell or cells. This operation is typically, but not necessarily exclusively, performed by an end-user of the OTP element memory core 120 after the OTP element memory core 120 has been programmed and verified during programming and verification modes, respectively.

After OTP element memory core 120 completes programming, reading and verification modes of the identified memory cell, the OTP element memory core 120 may proceed to identify another memory cell. The newly identified memory cell will be subject to programming, reading and/or verification modes as desired by the user and/or OTP element memory core 120.

A more detailed description of programming mode, reading mode, and verification mode follows. As would be understood by one skilled in the relevant art, other embodiments of each mode or combination of modes is possible to achieve reliable programming of the fuse, thus, the present invention is not limited to the embodiments described below.

a. Programming Mode.

FIGS. 9(a, b, c, d) illustrate a method 900 of operation of OTP element memory core 120 in the programming mode. FIG. 9a illustrates general steps of the method 900. FIGS. 9b, 9c, and 9d illustrates details of particular steps of method 900 shown in FIG. 9a.

Figure 9A:
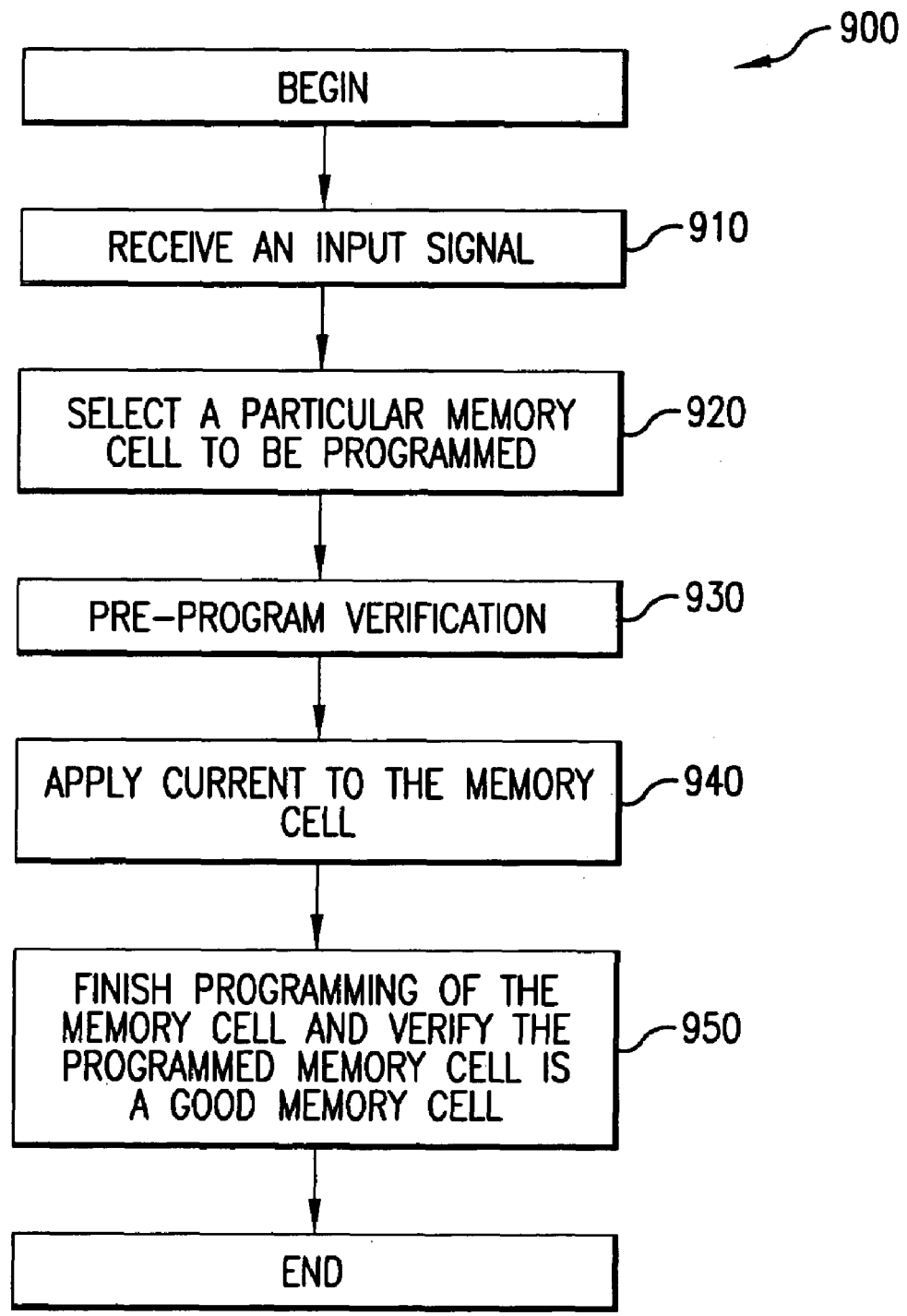
FIG. 9a is flow chart diagram illustrating a method for programming a one-time programmable element memory core.

FIG. 9a illustrates method 900 for programming a memory cell 601 in the fuse array 230. In step 910, OTP element memory core 120 receives an input signal from digital interface 130. The input signal includes a CLK signal 275 that drives internal timing generator 270. The input signal further includes input address signal 245 that drives address decoder 240.

The processing then proceeds to step 920, where OTP element memory core 120 selects a memory cell 601 within fuse array 230 for programming. Step 920 is further described by FIG. 9b.

Figure 9B:
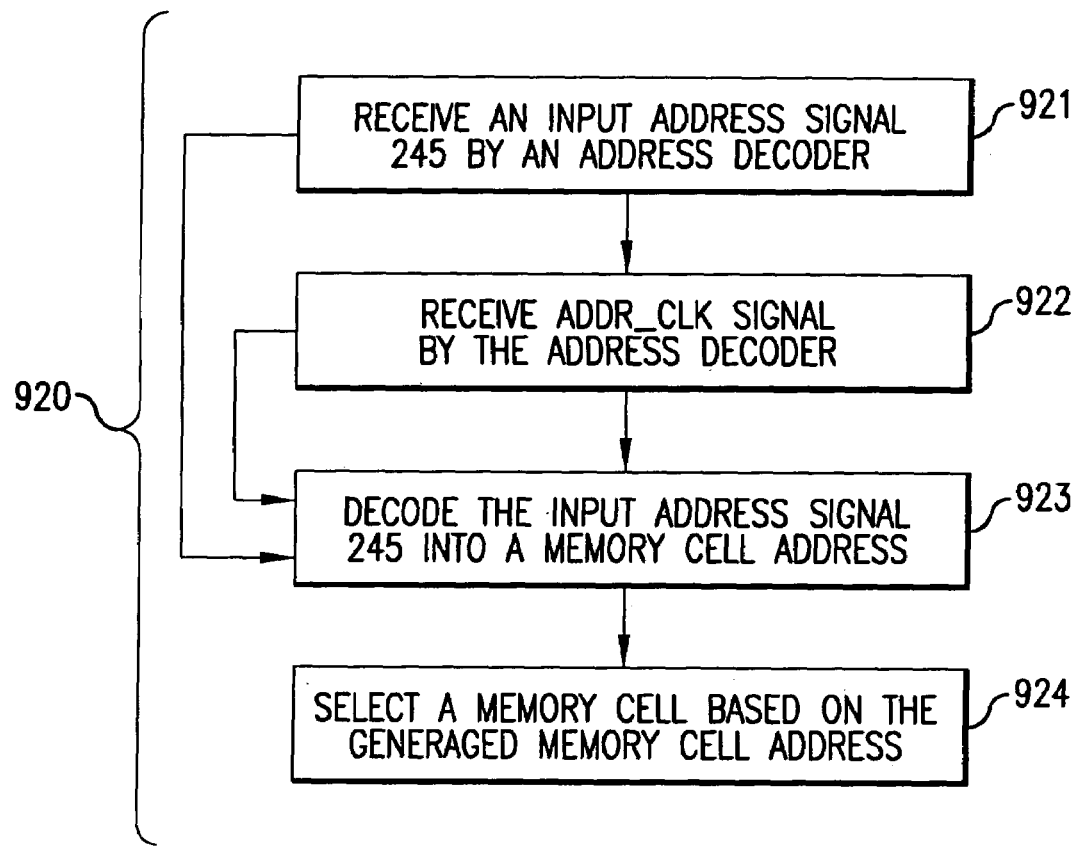

Referring to FIG. 9b, in step 921, address decoder 240 receives 8-bit input address signal 245 from digital interface 130. 8-bit input address signal 245, when decoded by address decoder 240, defines a memory cell 601 within fuse array 230.

In step 923, address decoder 240 decodes and 8-bit input address signal 245 into COL signal 241 and WRITE_ROW signal 242. COL signal 241 defines a particular column in the row-column matrix arrangement of fuse array 230 where memory cell 601 selected for programming is located. WRITE_ROW signal 242 defines a particular row in the row-column matrix arrangement of fuse array 230 where memory cell 601 selected for programming is located. COL signal 241 and WRITE_ROW signal 242 are generated based on the information supplied by input address signal 245. The processing proceeds to step 924, where memory cell 601 within row-column matrix arrangement of fuse array 230 is selected.

Figure 9C:
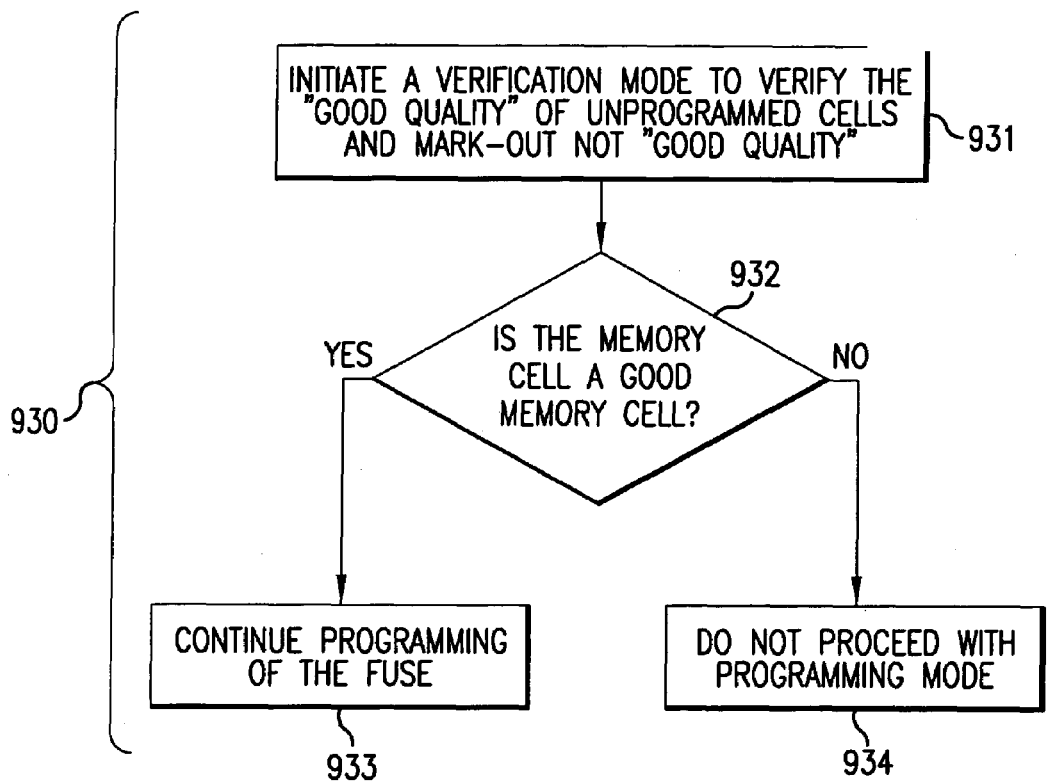

The selected memory cell 601 in fuse array 230 is optionally verified prior to programming. In the example of FIG. 9a, pre-programming verification is illustrated as step 930. Alternatively, pre-programming verification can be performed prior to step 930, such as prior to step 910. An example implementation of step 930 is illustrated in FIG. 9c. Referring to FIG. 9c, in step 931 a user can initiate a verification mode to verify the "good quality" unprogrammed memory cells 601. If the selected memory cell 601 is a "good quality" memory cell 601, then the user proceeds with programming memory cell 601, as shown in step 933. If selected memory cell 601 is not "good quality" memory cell, then the user designates the cell as not having "good quality" and does not proceed with programming, as shown in step 934. This process can be performed before OTP element memory core 120 is delivered to a potential customer or an end-user.

OTP element memory core 120 performs verification of memory cell 601 during the programming mode using a digital sequencer 280 (as shown in FIG. 2). Digital sequencer 280 times the actual programming of the memory cell and verification of memory cell 601 during the programming mode. Digital sequencer 280 ensures that ample time is given for the completion of each of the programming and verification stages.

Referring back to FIG. 9a, after the programming mode is initiated, the processing proceeds to step 940. In step 940, a programming current is applied to selected memory cell 601.

Figure 9D:
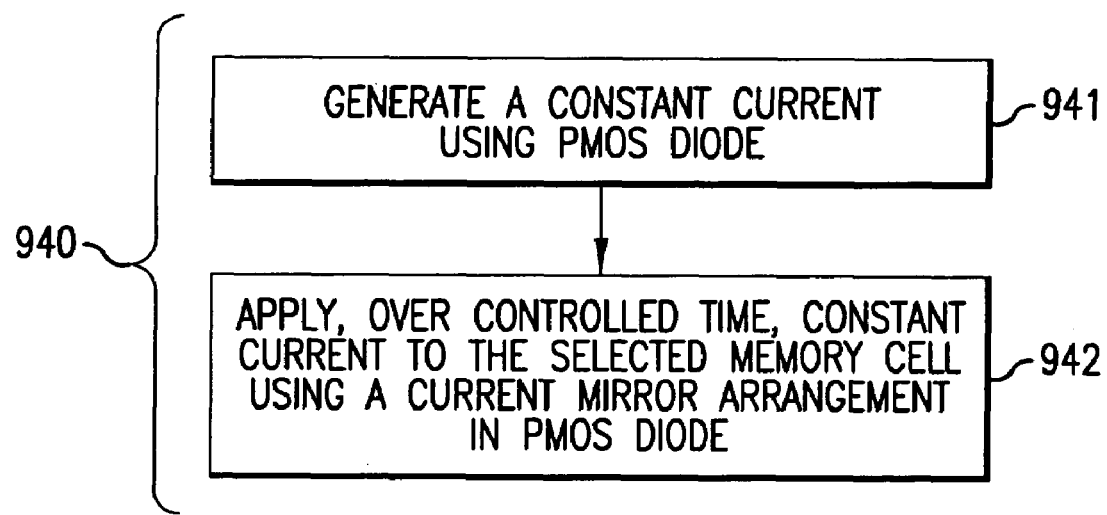

FIG. 9d further describes step 940. In step 941, PMOS diode 210 generates a constant amount of current and applies it to memory cell 601. The current is applied using PMOS diode 210 configuration (as described in FIG. 3b). PMOS diode 210 generates the voltage used to bias the gate of a current source transistor in the memory cell 601 over a controlled time period, as indicated by step 942. In an embodiment of the present invention, the time period that defines application of programming current to selected memory cell 601 is determined as a function of a system clock. For example, in FIG. 5b, system clock 275 is provided from digital sequencer 280. Internal timing generator 270 uses system clock 275 to generate ROW_CLK 271 and COL_CLK 272. The time period that defines application of programming current to selected memory cell 601 is determined by ROW_CLK 271. ROW_CLK 271 is generated by internal timing generator 270 as a function of system clock 275. Using a current mirror configuration enables control of the amount of current that passes through selected memory cell 601 and ensures that the current can be applied evenly over time. This is different from conventional systems, where current applies in massive dosages melting the poly-silicon layer of the fuse causing the molten poly-silicon to re-flow back into original configuration.

Referring back to FIG. 9a, in step 950, OTP element memory core 120 finishes programming mode. OTP element memory core 120 also verifies that programmed memory cell 601 is a good memory cell. This is referred to as a post-verify event. This verifies that the programmed memory cell 601 is programmed to high resistance. Digital sequencer 280 switches OTP element memory core 120 from the actual programming part of the programming mode to the verification part of the programming mode. After verification is completed, the digital sequencer 280 issues a signal indicating completion of the programming mode.

After the programming mode, digital interface 130 (see FIG. 1) can switch OTP element memory core 120 to the reading mode. The reading mode is described in below in detail.

Figure 9E:
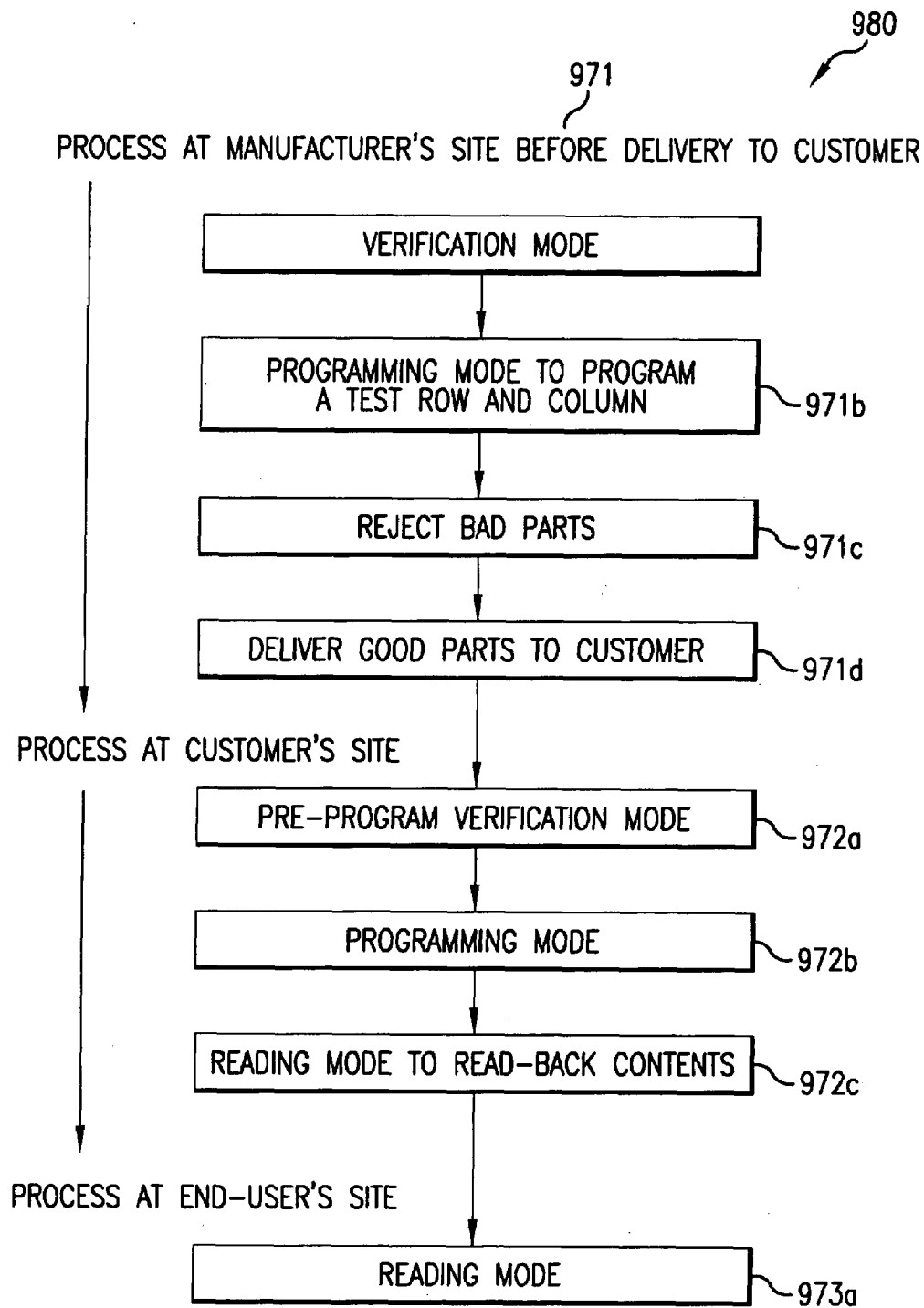
FIG. 9e is a flow chart diagram illustrating an application of the one-time programmable element memory shown in FIG. 1.

FIG. 9e is a flowchart diagram illustrating a sequence of processes 980 including a process at a manufacturer's site 971, a process at a customer's site 972, and a process at an end-user's site 973.

The process at the manufacturer's site 971 includes a verification mode 971a, a programming mode to program a test row and a column 971b, a step of rejecting bad parts (i.e., memory cells 601 qualified as not having "good quality") 971c, and a step of delivering good parts (i.e., memory cells 601 qualified as having "good quality") to customer 971d.

The process at the customer's site 972 includes a pre-programming verification mode 972a, followed by a programming mode 972b, and a reading mode 972c to determine contents of a memory cell.

The process at the end-user's site 973 includes a reading mode 973a.

As would be understood by one having ordinary skill in the art, other systems and methods for programming a memory cell are possible as long as they are within the scope and spirit of the present invention.

b. Reading Mode.

Figure 12:
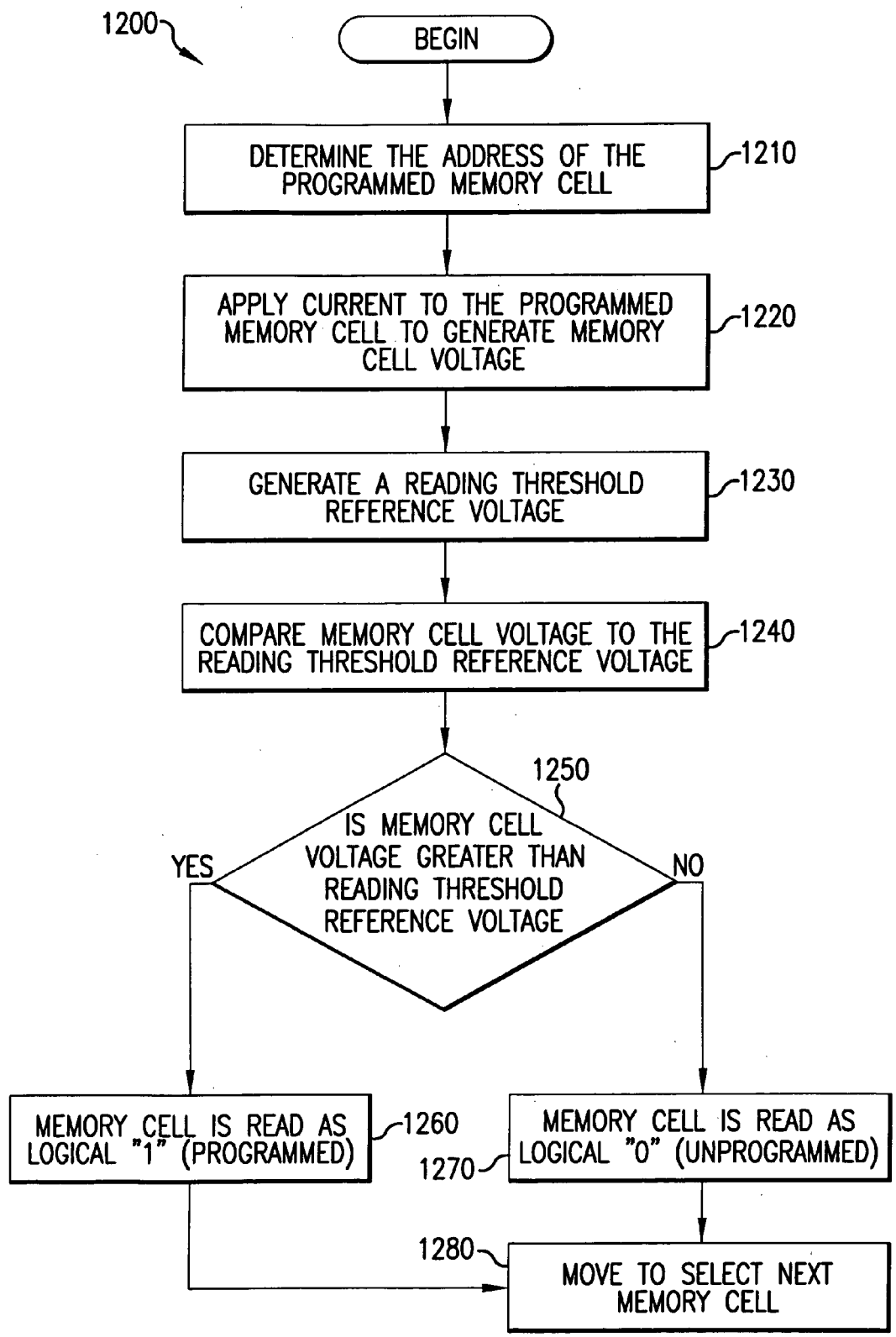
FIG. 12 is flow chart diagram illustrating a method for reading a one-time programmable element memory core.

FIG. 12 describes a method 1200 of operation of OTP element memory core 120 during the reading mode.

In FIG. 12, OTP element memory core 120 determines whether a selected memory cell 601 is programmed or unprogrammed. During the reading mode, OTP element memory core 120 utilizes current reference generator 220, verification circuits 260 and sense amplifier 250.

In step 1210, the OTP element memory cell 120 selects a memory cell 601 for reading using COL 241 and WRITE_ROW 242 signals (as shown in FIGS. 2 and 3b). COL 241 and WRITE ROW 242 are the same signals used to select a memory cell 601 for programming.

The processing proceeds to step 1220, where current reference generator 220 provides IFEED current signal 222 to the selected memory cell 601 within fuse array 230. Upon application of current to the selected memory cell 601, a fuse voltage is generated. The fuse voltage is monitored by sense amplifier 250 via RDLINE signal line 231.

In step 1230, OTP element memory core 120 generates a reading threshold voltage VT_READ 1113 (as shown in FIG. 11). Reading threshold voltage VT_READ 1113 is compared to the fuse voltage generated in step 1220.

Referring to FIGS. 10 and 11, in step 1230, verification circuit 260 generates READ_VREF signal 1013 based on the signals supplied to it from OTP element memory core 120. READ_VREF signal 1013 is applied to transistor switch 1007, which closes transistor switch 1007. VT_READ 1032 is provided at terminal VREF_OUT 264 of verification circuit 260, as a result of transistor switch 1007 closing.

In step 1240, OTP element memory core 120 compares the fuse voltage, generated in step 1220, and VT_READ 1032, generated in step 1230.

If, in decision step 1250, the fuse voltage is greater than VT_READ 1032, then selected memory cell 601 is read as programmed (corresponding to logical '1') (step 1260). If the fuse voltage is less than VT_READ 1032, then selected memory cell 601 is read as unprogrammed (that is logical '0'). OTP element memory core 120 uses sense amplifier 250 to compare the voltages. Sense amplifiers 250, via RDLINE signal line 231, monitors the fuse voltage (as shown in FIG. 10). If the fuse voltage is greater than VT_READ 1032, sense amplifier 250 generates a signal indicating that selected memory cell 601 is programmed.

Figure 15:
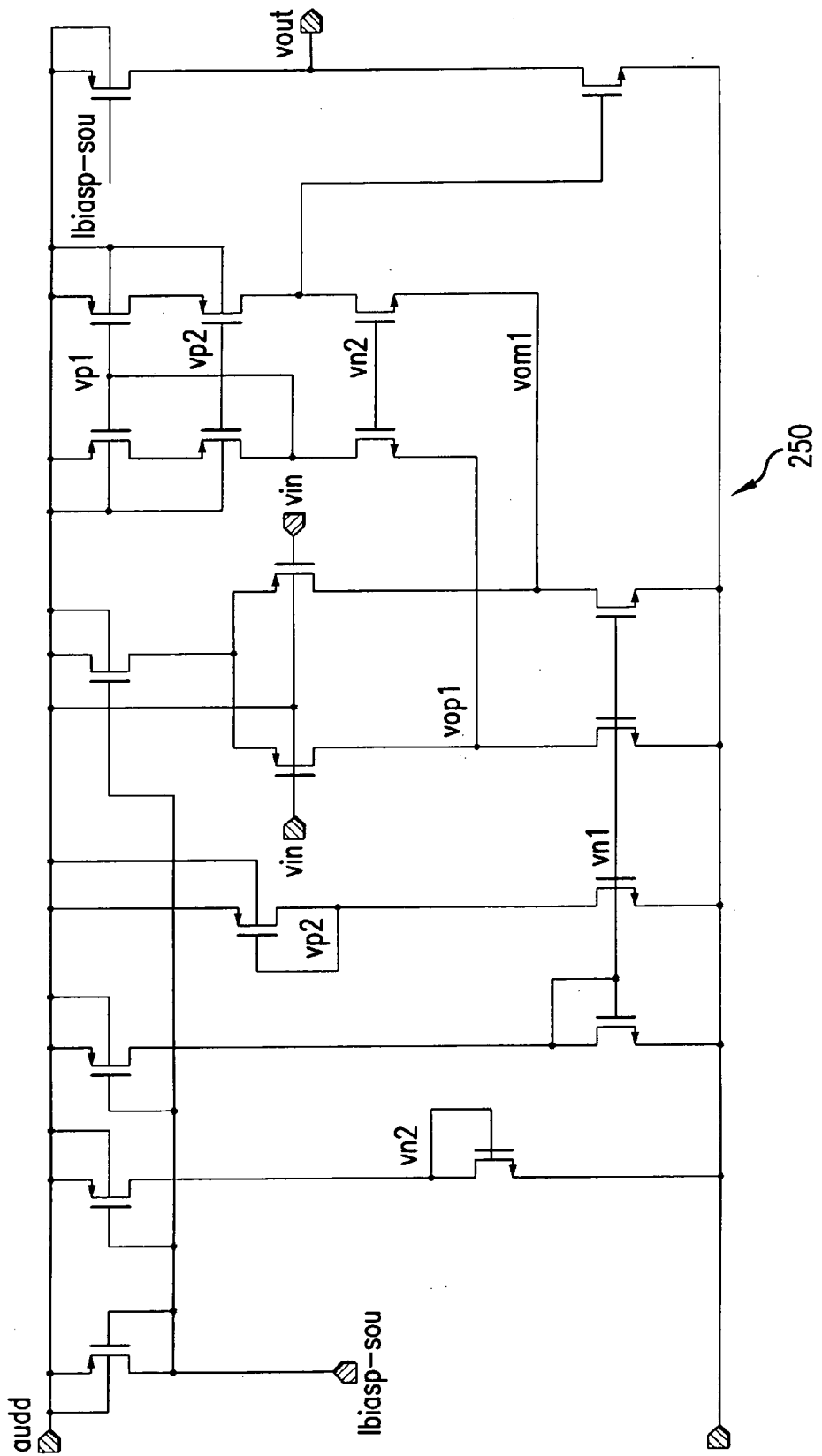
FIG. 15 illustrates an example embodiment of a sense amplification circuit.

In an embodiment, sense amplifier 250 includes a folded-cascade stage cascaded with a NMOSFET that is biased in class-A configuration, as shown in FIG. 15. The folded cascade stage is designed using large input transistors. Furthermore, sense amplifier 250 uses long-length transistors in current mirrors to minimize offsets. Other embodiments of sense amplifier 250 are possible.

In an embodiment, OTP element memory core 120 can initiate a verification mode after the reading mode is over. In another embodiment, a user can initiate the verification mode. The verification mode ensures that the programming of the selected memory cell 601 was done correctly or it can be used to verify the unprogrammed status of the cell 601. During the verification mode, OTP element memory core 120 compares selected memory cell 601 fuse voltage against thresholds generated by the system. The following is a detailed description of a method of operation of OTP element memory core 120 during the verification mode.

c. Verification mode.

Figure 13A:
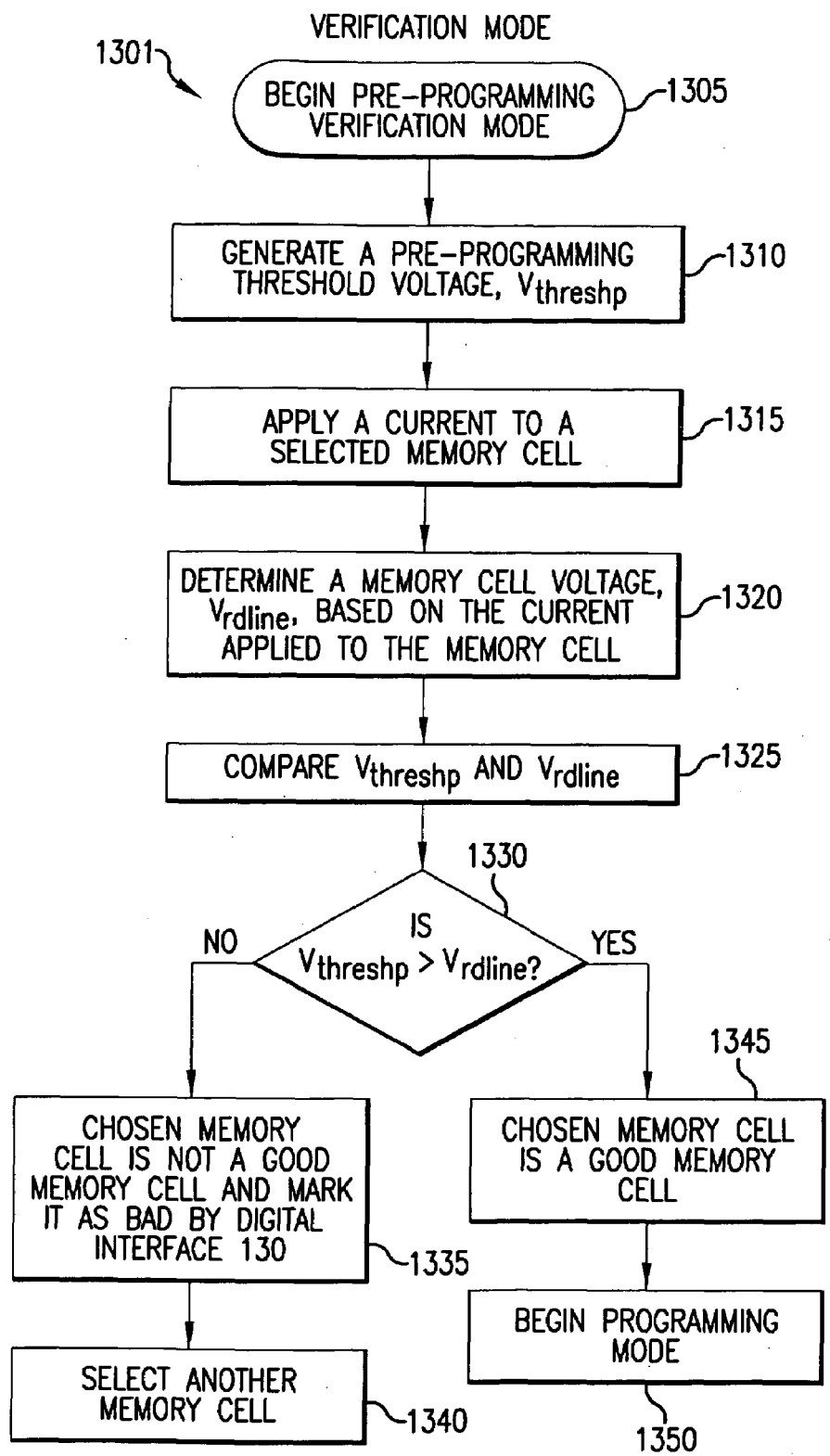
FIG. 13a is flow chart diagram illustrating a method for verifying an unprogrammed one-time programmable element memory core.
Figure 13B:
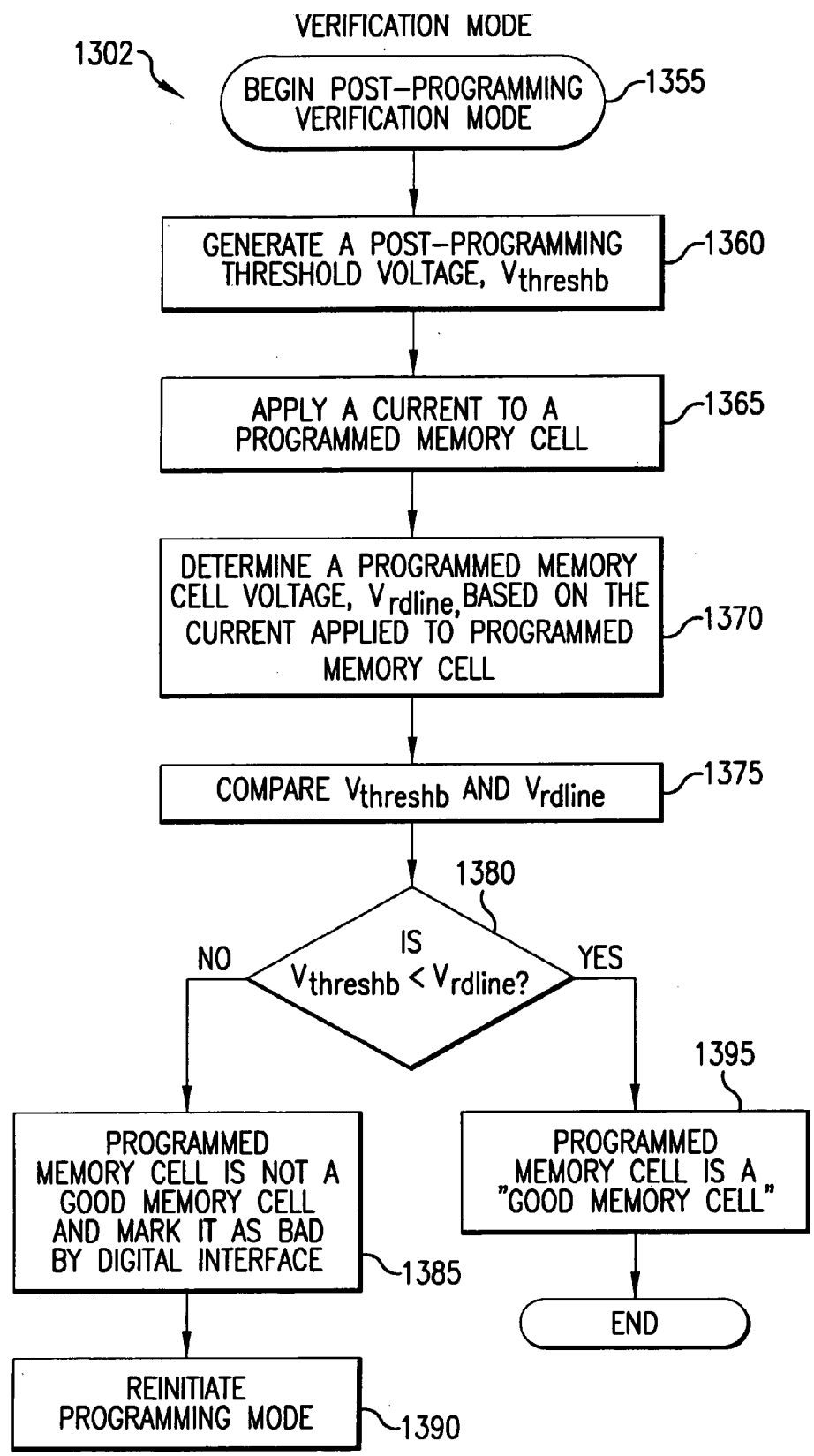
FIG. 13b is flow chart diagram illustrating a method for verifying a programmed one-time programmable element memory core.

FIGS. 13*a*–*b* illustrate a method of operation of OTP element memory core 120 during the verification mode. FIG. 13*a* illustrates steps of the method of operation 1300 during a pre-programming verification mode. FIG. 13*b* illustrates steps of the method of operation 1302 during a post-programming verification mode.

Referring to FIG. 13*a*, in step 1305, OTP element memory core 120 initiates a pre-programming verification mode of the selected memory cell 601. The pre-programming verification mode ensures that the selected memory cell 601 is a "good quality" memory cell. In other words, that the fuse voltage of memory cell 601 is below a defined threshold voltage.

In step 1310, OTP element memory core 120 generates the pre-programming verification threshold voltage $V_{threshp}$ 1114. In step 1311 (FIG. 13*c*), verification circuit 260 generates VERIFY_PREBLOWN current 1014 based on signals received from OTP element memory core 120. In step 1312, VERIFY_PREBLOWN current 1014 is applied to transistor switch 1008, which closes transistor switch 1008. In step 1313, voltage $V_{threshp}$ 1114 is provided at output terminal 264 of the verification circuit 260 through the transistor switch 1008.

Referring back to FIG. 13*a*, in step 1315, current IFEED 222 from current reference generator 220 is applied to a selected memory cell 601. Because memory cell 601 is not programmed, it has a low resistance. Therefore, a low fuse voltage is generated upon application of IFEED current 222 to selected memory cell 601.

In step 1320, the low fuse voltage is monitored by RDLINE signal line 231. RDLINE signal line 231 supplies the low fuse voltage to sense amplifier 250 for comparison with $V_{threshp}$ voltage 1114. The threshold voltage 1114 is lower than the reading threshold voltage to ensure verification of the unprogrammed fuse.

In step 1325, sense amplifier 250 compares $V_{threshp}$ voltage 1114 and the low fuse voltage as monitored by RDLINE 231. The processing proceeds to decision step 1330. In step 1330, sense amplifier 250 determines whether the fuse voltage on RDLINE 231 ($V_{RDLINE}$) is less than the threshold voltage $V_{threshp}$ 1114. If sense amplifier 250 determines that $V_{RDLINE}$ is less than $V_{threshp}$ then processing proceeds to step 1345.

In step 1345, sense amplifier 250 generates a signal that the selected memory cell 601 is a "good quality" memory cell. This means that upon application of current to the memory cell 601, a low fuse voltage is generated that is less than a threshold voltage 1114. In step 1350, the user can then proceed to the programming mode, described in FIGS. 9*a*–*d*.

If in decision step 1330, threshold voltage 1114 is not less than the fuse voltage as monitored by RDLINE 231, then sense amplifier 250 generates a signal indicating that selected memory cell 601 is not a "good quality" memory cell. Therefore, in step 1350, OTP element memory core 120 is prompted to select another memory cell.

After programming, the system switches to a post-programming verification mode. This mode verifies that the programmed memory cell 601 was programmed and that upon application of a current it generates a high programming voltage. The high programming voltage results from application of current to programmed memory cell having high resistance.

FIG. 13*b* illustrates steps of the method of operation 1302 during a post-programming verification mode. Referring to FIG. 13*b*, in step 1355, OTP element memory core 120 initiates a post-programming verification mode of the programmed memory cell 601. The post-programming verification mode ensures that the programmed memory cell 601 is properly programmed.

In step 1360, OTP element memory core 120 generates the post-programming verification threshold voltage $V_{threshb}$ 1112. Verification circuit 260 (FIG. 13*d*) generates VERIFY_BLOWN current 1012 based on signals received from OTP element memory core 120. VERIFY_BLOWN current 1012 is applied to transistor switch 1006, which closes transistor switch 1006. Voltage $V_{threshb}$ 1112 is provided at output terminal 264 of the verification circuit 260 through the transistor switch 1006.

Referring back to FIG. 13*b*, in step 1365, current IFEED 222 from current reference generator 220 is applied to programmed memory cell 601. Because memory cell 601 is programmed, it has a high resistance. Therefore, a high fuse voltage is generated upon application of IFEED current 222 to programmed memory cell 601.

In step 1370, the high fuse voltage is monitored by RDLINE signal line 231. RDLINE signal line 231 supplies the high fuse voltage sense amplifier 250 for comparison with $V_{threshb}$ voltage 1112. The threshold voltage 1112 is purposefully skewed to provide for a highest possible threshold voltage.

In step 1375, sense amplifier 250 compares $V_{threshb}$ voltage 1112 and the high fuse voltage as monitored by RDLINE 231. The processing proceeds to decision step 1380. In step 1380, sense amplifier 250 determines whether fuse voltage determined by RDLINE 231 ($V_{RDLINE}$) is greater than threshold voltage $V_{threshb}$ 1112. If sense amplifier 250 determines that $V_{RDLINE}$ is greater than $V_{threshb}$ then processing proceeds to step 1395.

In step 1395, sense amplifier 250 generates a signal that the programmed memory cell 601 is properly programmed. This means that upon application of current to programmed memory cell 601, a high fuse voltage is generated that is greater than threshold voltage 1112.

If in decision step 1380, threshold voltage 1112 is not greater than the fuse voltage as monitored by RDLINE 231, then sense amplifier 250 generates a signal indicating that programmed memory cell 601 is not properly programmed. In other words, fuse voltage of memory cell 601 is less than the highest threshold voltage. Therefore, in step 1390, OTP element memory core 120 is prompted to select another memory cell from fuse array 230 and re-initiate the programming mode.

Figure 13E:
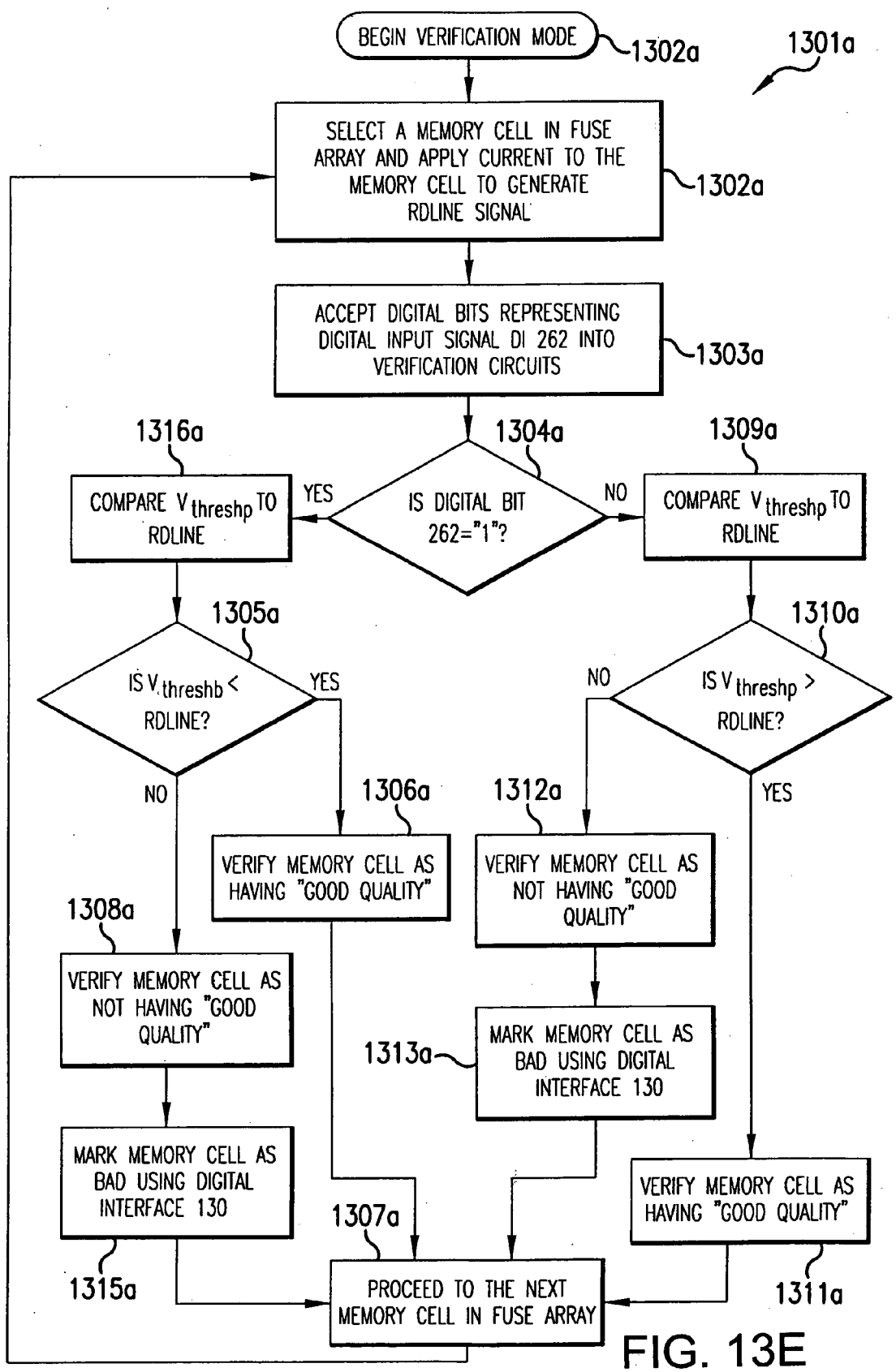
FIG. 13e is a flow chart diagram illustrating independent initiation of a verification mode.

FIG. 13*e* is a process flowchart for independent initiation of verification mode 1301*a*. In step 1302*a*, verification mode 1301*a* begins by selecting memory cell 601 in fuse array 230 and applying a current to the selected memory cell 601 to generate RDLINE signal 231. The processing proceeds to step 1303*a*.

in step 1303*a*, digital bits representing digital input signal DI 261 are inputted to verification circuits 260. The digital bit has values of either '0' or '1', where '0' indicates absence of current and '1' indicates presence of current.

In decision step 1304a, if a digital bit of digital input signal DI 261 has a value of '1', then processing proceeds to step 1305a.

In step 1305a, voltage signal $V_{threshb}$ 1112 is compared to RDLINE signal 231, as shown in step 1316a. If $V_{threshb}$ 1112<RDLINE signal 231, then the selected memory cell 601 is a "good quality" memory cell, as shown in step 1306a. The process then proceeds to step 1307a to select another memory cell 601 for verification.

If in step 1305a, $V_{threshb}$ 1112<RDLINE signal 231, then selected memory cell 601 is not a "good quality" memory cell, as shown in step 1308a. A signal is sent to digital interface 130 indicating that selected memory cell 601 is not a "good quality" memory cell, as shown in step 1315a. The processing then proceeds to step 1307a to select another memory cell for verification.

If in decision step 1304a the digital bit of digital input signal DI 261 has a value of '0', then processing proceeds to step 1309a. In step 1309a, voltage signal $V_{threshp}$ 1114 is compared to RDLINE signal 231.

Referring to step 1310a, if $V_{threshp}$ 1112>RDLINE signal 231, then the selected memory cell is verified as a "good quality" memory cell, as shown in FIG. 1311a. The processing then proceeds to step 1307a, where another memory cell is selected for verification.

If in step 1310a $V_{threshp}$ 1112<RDLINE signal 231, then the selected memory cell 601 is verified as not having "good quality", as shown in step 1312a. A signal is sent to digital interface 130 indicating that the selected memory cell 601 does not have "good quality", as shown in step 1313a. The processing then proceeds to step 1307a, where another memory cell is selected for verification.

4. Poly-Si Fuse Design.

Figure 14A:
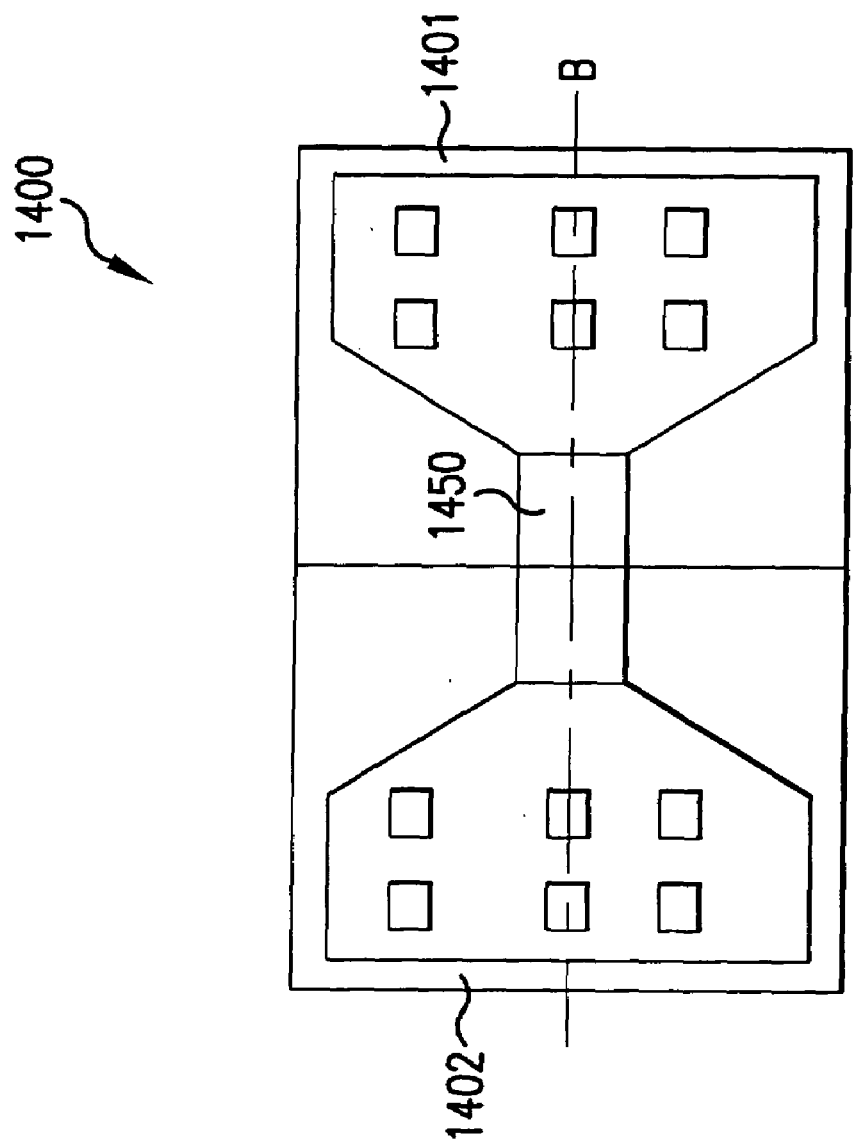
FIG. 14a illustrates a top view of a one-time programmable element memory cell, according to the present invention.
Figure 14B:
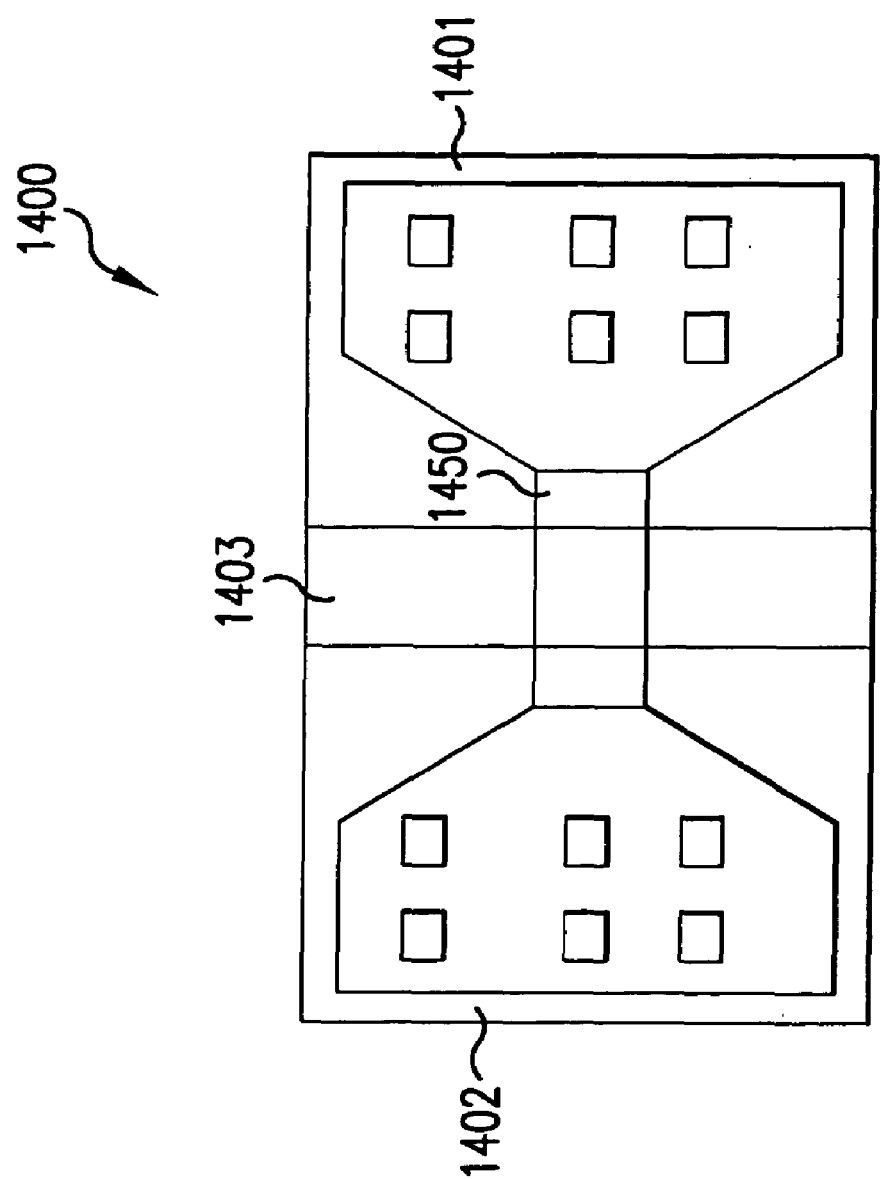
FIG. 14b illustrates a top view of another one-time programmable element memory cell, according to the present invention.
Figure 14C:
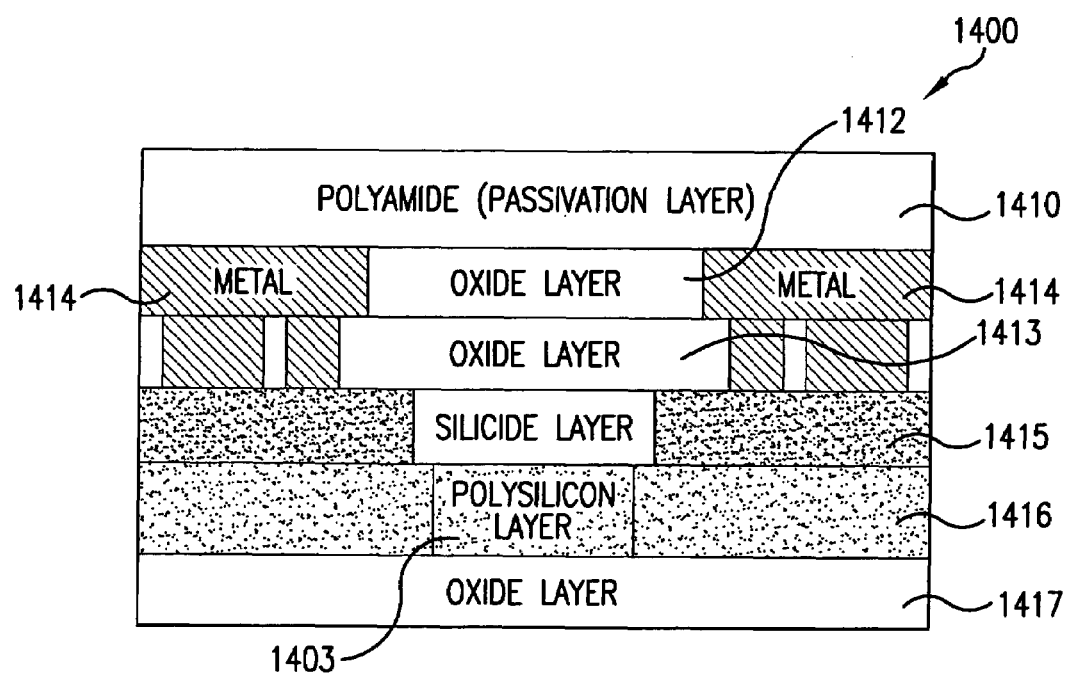
FIG. 14c is a cross-sectional view of an unprogrammed memory cell, according to the present invention.
Figure 14D:
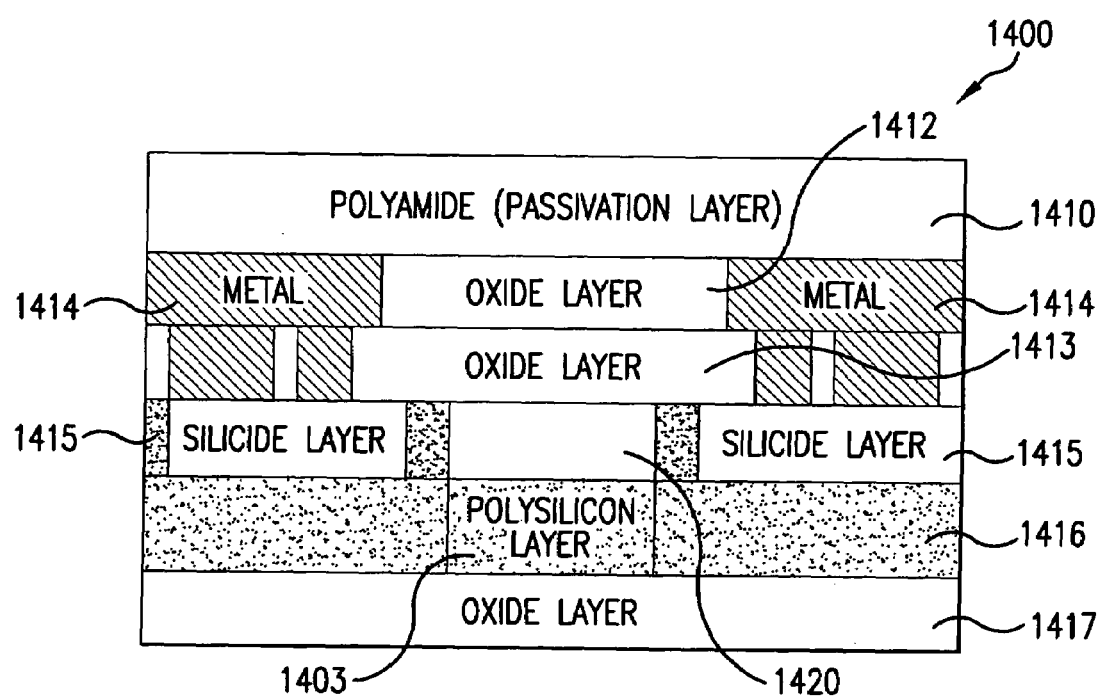
FIG. 14d is a cross-section view of a programmed memory cell, according to the present invention.

FIGS. 14a–d illustrate a one-time programmable fuse 1400 in accordance with the present invention. FIG. 14a illustrates a top view of the one-time programmable fuse 1400. FIG. 14b illustrates a top view of a practical implementation of one-time programmable fuse 1400. FIG. 14c is a cross-sectional view of an unprogrammed fuse 1400 shown in FIG. 14b. FIG. 14d FIG. 14c is a cross-sectional view of a programmed fuse 1400 shown in FIG. 14b. The following is a description of the designs shown in FIGS. 14a–d. Further details of the one-time programmable fuse 1400 can be found in U.S. patent application Ser. No. 10/115,013, to Akira et al., filed Apr. 4, 2002, which is incorporated by reference herein in its entirety.

FIG. 14a illustrates a polycide fuse 1400 having an N+implantation region 1401, a P+ implantation region 1402 and a poly-silicon layer 1450. The implant regions 1401 and 1402 are drawn over the poly-silicon layer 1450.

During the fabrication process of the polycide fuse 1400, N+implantation region 1401 and P+ implantation region 1402 typically overlap, forming a third region 1403, as shown in FIG. 14b. This third region is referred to as an intrinsic region (or neutral region). Intrinsic region 1403 is a region of poly-silicon that is nether P+ doped nor N+ doped. In an embodiment, intrinsic region 1403 is formed by an overlap of P+ implantation region 1402 and N+ implantation region 1401. In another embodiment, intrinsic region 1403 is formed by defining an implantation blocking region. The three regions 1401, 1402 and 1403 have different sheet resistances with the intrinsic region 1403 having the highest sheet resistance. The silicide layer 1415 is similarly affected by the above described implantation process as the polysilicon layer 1450.

FIGS. 14c and 14d illustrate a cross sectional view of the polycide fuse 1400 of FIG. 14b. Polycide fuse 1400 includes a polyamide layer 1410, metal layer 1414, oxide layers 1412 and 1413, a silicide layer 1415, a poly-silicon layer 1416 with the intrinsic region 1403a and an oxide layer 1417. FIG. 14d illustrates a cross-section view of a programmed fuse 1400, where a void window 1420 is created in the poly-silicon layer 1416.

The structural details of fuse 1400 are described in U.S. patent application Ser. No. 10/115,013, to Akira et al., filed Apr. 4, 2002, which is incorporated by reference herein in its entirety.

As would be understood by one having ordinary skill in the art, the fusing performance of a fuse depends on a number of factors such as programming current, programming time, fuse size, fuse shape, silicide and poly-silicon quality. The better fusing performance in the new tri-region polycide fuses is due to the better quality silicide lines that are formed on tri-region polysilicon layer, FIG. 14b, as compared to other types of doped polysilicon. The presence of the silicide layer 1415 acts as a smaller resistance in parallel with the poly-silicon layer 1416 to form a fuse resistance that is much smaller than a polysilicon fuse without silicide. A higher-quality silicide line will ensure better fusing success rate statistically.

Due to the tri-region arrangement in fuse 1400, when the programming current is injected into the fuse, more heat is generated in intrinsic region 1403. Intrinsic region 1403 is specially located in a region where the layers are more even and this region is situated at the center of the fuse, away from the uneven end regions of the fuse, as shown in FIGS. 14b–d. This improves the chance of the silicide melting at the fuse center and for the silicide strip to retreat more easily into two separate equal parts from the center.

Referring to FIG. 11, the post-programming resistance (e.g., 1102) of the fuse is much higher with the intrinsic region 1403 (i.e., neutral p and n doping in the middle of the fuse), than with a conventional doped polysilicon fuse, while the pre-programming resistance (e.g., 1101) is not much higher. This provides a larger spread between pre-programmed versus post-programmed fuses, than is available with conventional fuses. For this reason, the statistical reliability of accurately reading whether a fuse is programmed is much better than with conventional doped polysilicon fuses.

5. CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method for programming a memory cell, comprising:
applying a voltage to a first transistor, whereby a first current is varied by said first transistor;
controlling a second current with a second transistor, whereby said second current is proportional to said first current;

passing said second current through the memory cell, whereby said second current programs the memory cell;
biasing said first transistor with a bias circuit, whereby a bias current flows in said bias circuit; and
varying said first current in said first transistor as a function of said bias current in said bias circuit.

2. The method of claim 1, further comprising:
varying said first current as a function of a resistance coupled to said first transistor.

3. The method of claim 2, further comprising:
controlling the length of time that said second current is available to flow through the memory cell.

4. The method of claim 3, wherein the memory cell comprises a poly-silicon fuse with an intrinsic poly-silicon region.

5. The method of claim 2, wherein the memory cell comprises a poly-silicon fuse with an intrinsic poly-silicon region.

6. The method of claim 1, further comprising:
applying a second voltage to said first transistor.

7. The method of claim 6, further comprising:
varying said first current in said first transistor as a function of said first and second voltages.

8. The method of claim 1, further comprising:
controlling the length of time that said second current is available to flow through the memory cell.

9. The method of claim 8, wherein the memory cell comprises a poly-silicon fuse with an intrinsic poly-silicon region.

10. The method of claim 1, wherein the memory cell comprises a poly-silicon fuse with an intrinsic poly-silicon region.

11. The method of claim 1, further comprising:
varying said proportionality of said second current to said first current.

12. A system for programming a memory cell, comprising:
a first transistor including a source terminal coupled to a source voltage, and further including gate and drain terminals coupled to one another at a common terminal wherein a drain current flows through said drain terminal; and
a second transistor including a source terminal coupled to said source voltage, a gate terminal coupled to said common terminal, and a drain terminal coupled to the memory cell;
whereby said second transistor provides a controlled current to program the memory cell.

13. The system of claim 12, wherein said first and second transistors are implemented in a current mirror configuration.

14. The system of claim 12, further comprising:
a second voltage applied to said first transistor.

15. The system of claim 14, wherein said drain current in said first transistor is varied as a function of said source and second voltages.

16. The system of claim 12, wherein said second transistor provides said controlled current to the memory cell for a controlled length of time.

17. The system of claim 16, wherein the memory cell comprises a poly-silicon fuse with an intrinsic poly-silicon region.

18. The system of claim 12, wherein the memory cell comprises a poly-silicon fuse with an intrinsic poly-silicon region.

19. The system of claim 12, whereby said controlled current is proportional to said drain current.

20. The system of claim 12, wherein said first and second transistors comprise N-type metal oxide semiconductor transistors.

21. The system of claim 12, wherein at least one of said first and second transistors comprises at least one of N-type semiconductor material and P-type semiconductor material.

22. The system of claim 12, wherein said second transistor gate terminal is coupled to said common terminal through a third transistor, wherein said third transistor controls said coupling between said second transistor and said common terminal.

23. A system for programming a memory cell, comprising:
a first transistor including a source terminal coupled to a source voltage and further including gate and drain terminals coupled at a common terminal wherein a first current flows through said drain terminal;
a second transistor including a source terminal coupled to said source voltage, a gate terminal coupled to said common terminal, and a drain terminal coupled to the memory cell;
whereby said second transistor provides a controlled current to program the memory cell; and
a resistance coupled between said common terminal and a voltage terminal.

24. The system of claim 23, wherein said second transistor gate terminal is coupled to said common terminal through a third transistor.

25. The system of claim 24, wherein said first and second transistors comprise P-type metal oxide semiconductor transistors.

26. The system of claim 23, further comprising:
a bias circuit coupled to said first transistor, wherein a bias current flows through said bias circuit.

27. The system of claim 26, whereby a first current is varied by said first transistor as a function of said bias current in said bias circuit.

28. The system of claim 27, wherein said second transistor provides said controlled current to the memory cell for a controlled length of time.

29. The system of claim 28, wherein the memory cell comprises a poly-silicon fuse with an intrinsic poly-silicon region.

30. The system of claim 27, wherein the memory cell comprises a poly-silicon fuse with an intrinsic poly-silicon region.

31. The system of claim 26, whereby said bias circuit includes a resistance and said bias current is a function of said resistance.

32. The system of claim 31, whereby said first transistor varies said first current as a function of said bias current in said bias circuit.

33. The system of claim 23, wherein said second transistor provides said controlled current to the memory cell for a controlled length of time.

34. The system of claim 33, wherein the memory cell comprises a poly-silicon fuse with an intrinsic poly-silicon region.

35. The system of claim 23, wherein the memory cell comprises a poly-silicon fuse with an intrinsic poly-silicon region.

36. A method for programming a memory cell, comprising:
applying a voltage to a first transistor, whereby a first current is varied by said first transistor;

biasing said first transistor with a bias circuit, wherein said bias circuit includes a resistance and a bias current, whereby said bias current is a function of said resistance;

biasing a second transistor with said bias circuit, whereby a second current proportional to said first current is controlled by said second transistor; and passing said second current through the memory cell, whereby said second current programs the memory cell.

37. The method of claim 36, whereby said first current in said first transistor varies as a function of said bias current in said bias circuit.

* * * * *

UNITED STATES PATENT AND TRADEMARK OFFICE
CERTIFICATE OF CORRECTION

| | |
|---|---|
| PATENT NO. | : 7,211,843 B2 |
| APPLICATION NO. | : 10/355260 |
| DATED | : May 1, 2007 |
| INVENTOR(S) | : Low et al. |

Page 1 of 1

It is certified that error appears in the above-identified patent and that said Letters Patent is hereby corrected as shown below:

Table 1 (column 12, lines 39-47)
"Vthreseshb 1112" should be replaced with --Vthreshb 1112--.
"Vtthreshb" should be replaced with --Vthreshb--.

Signed and Sealed this

Thirty-first Day of July, 2007

JON W. DUDAS
*Director of the United States Patent and Trademark Office*